(12) United States Patent
Laurent et al.

(10) Patent No.: US 11,415,201 B2
(45) Date of Patent: Aug. 16, 2022

(54) DISPLAY LIFT ARM

(71) Applicant: Apple Inc., Cupertino, CA (US)

(72) Inventors: Kristopher P. Laurent, Campbell, CA (US); Brett W. Degner, Menlo Park, CA (US); Danny L. McBroom, Leander, TX (US); David H. Narajowski, San Jose, CA (US); Edward T. Sweet, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/583,222

(22) Filed: Sep. 25, 2019

(65) Prior Publication Data
US 2020/0378481 A1 Dec. 3, 2020

Related U.S. Application Data

(60) Provisional application No. 62/855,315, filed on May 31, 2019.

(51) Int. Cl.
F16H 21/10 (2006.01)
H05K 5/00 (2006.01)
(Continued)

(52) U.S. Cl.
CPC ........... *F16H 21/10* (2013.01); *F16M 11/046* (2013.01); *F16M 11/10* (2013.01);
(Continued)

(58) Field of Classification Search
CPC ..... F16H 21/10; G06F 1/1601; H05K 5/0204; H05K 5/0217; H05K 5/0234; F16M 11/10; F16M 11/08; F16M 11/2014; F16M 11/24; F16M 13/022; F16M 2200/04; F16M 2200/044; F16M 11/12; F16M 11/04; F16M 11/046; F16M 13/00; F16M 2200/063; F16M 2200/041
See application file for complete search history.

(56) References Cited

U.S. PATENT DOCUMENTS 4,080,530 A * 3/1978 Krogsrud ........... F16M 11/2014
362/427
4,160,536 A * 7/1979 Krogsrud ............... F16M 13/02
248/280.11
(Continued)

FOREIGN PATENT DOCUMENTS

CN 1633571 A 6/2005
CN 101965546 A 2/2011
(Continued)

*Primary Examiner* — Christopher Garft
(74) *Attorney, Agent, or Firm* — Dorsey & Whitney LLP

(57) ABSTRACT

A display assembly has a linkage and counterbalance made to provide non-tilting movement of a display at the end of a support arm while providing counterbalance equal to a change in potential energy of the display. The linkage can be a four-bar, parallelogram-shaped linkage, and the counterbalance can include a Scotch yoke configured to store energy in an energy storage device of the assembly as the support arm rotates. The display assembly can improve comfort and ease of moving a supported display while minimizing friction, hysteresis, and counterbalance mismatch.

17 Claims, 18 Drawing Sheets

(51) Int. Cl.
*G06F 1/16* (2006.01)
*H05K 5/02* (2006.01)
*F16M 11/10* (2006.01)
*F16M 11/04* (2006.01)
*F16M 11/20* (2006.01)

(52) U.S. Cl.
CPC ....... *F16M 11/2021* (2013.01); *G06F 1/1601* (2013.01); *H05K 5/0017* (2013.01); *H05K 5/0204* (2013.01); *H05K 5/0217* (2013.01); *H05K 5/0234* (2013.01); *F16M 2200/063* (2013.01)

(56) References Cited

U.S. PATENT DOCUMENTS

| | | | | |
|---|---|---|---|---|
| 4,682,749 | A * | 7/1987 | Strater | F16M 11/2021 248/592 |
| 4,709,588 | A * | 12/1987 | Cordes | E02F 3/42 248/281.11 |
| 5,170,975 | A * | 12/1992 | Chadwick | F16M 11/2064 403/53 |
| 5,501,420 | A | 3/1996 | Watt et al. | |
| 8,070,115 | B2 | 12/2011 | Wang et al. | |
| 8,256,725 | B2 * | 9/2012 | Wang | F16M 11/38 248/920 |
| 10,317,058 | B2 * | 6/2019 | Hung | F16M 11/06 |
| 10,801,660 | B1 * | 10/2020 | Liu | F16M 11/08 |
| 2004/0035989 | A1 | 2/2004 | Sweere et al. | |
| 2004/0245419 | A1 * | 12/2004 | Sweere | F16M 11/105 248/278.1 |
| 2008/0302926 | A1 * | 12/2008 | Cheng | F16M 13/02 248/161 |
| 2009/0166501 | A1 * | 7/2009 | Wang | F16M 11/10 248/419 |
| 2009/0173869 | A1 * | 7/2009 | Su | F16M 11/2064 248/617 |
| 2011/0006175 | A1 * | 1/2011 | Gwag | F16M 11/24 248/201 |
| 2012/0192382 | A1 | 8/2012 | Honsberger et al. | |
| 2012/0235000 | A1 * | 9/2012 | Borloz | F16M 11/2014 248/284.1 |
| 2015/0053829 | A1 * | 2/2015 | Lu | F16M 11/12 248/123.11 |
| 2015/0176755 | A1 * | 6/2015 | Lu | F16M 11/24 248/123.11 |
| 2017/0251805 | A1 * | 9/2017 | Graham | F16M 11/38 |
| 2017/0340408 | A1 * | 11/2017 | Oginski | F16M 13/027 |
| 2018/0112860 | A1 * | 4/2018 | Hung | F16M 11/046 |

FOREIGN PATENT DOCUMENTS

| | | |
|---|---|---|
| CN | 103047524 A | 4/2013 |
| CN | 103080626 A | 5/2013 |
| CN | 105605379 A | 5/2016 |
| CN | 108779891 A | 11/2018 |
| CN | 109764084 A | 5/2019 |
| FR | 2605757 A1 | 4/1988 |
| GB | 201113272 | 9/2011 |
| TW | M334587 U | 6/2008 |
| TW | 201127325 A | 8/2011 |

* cited by examiner

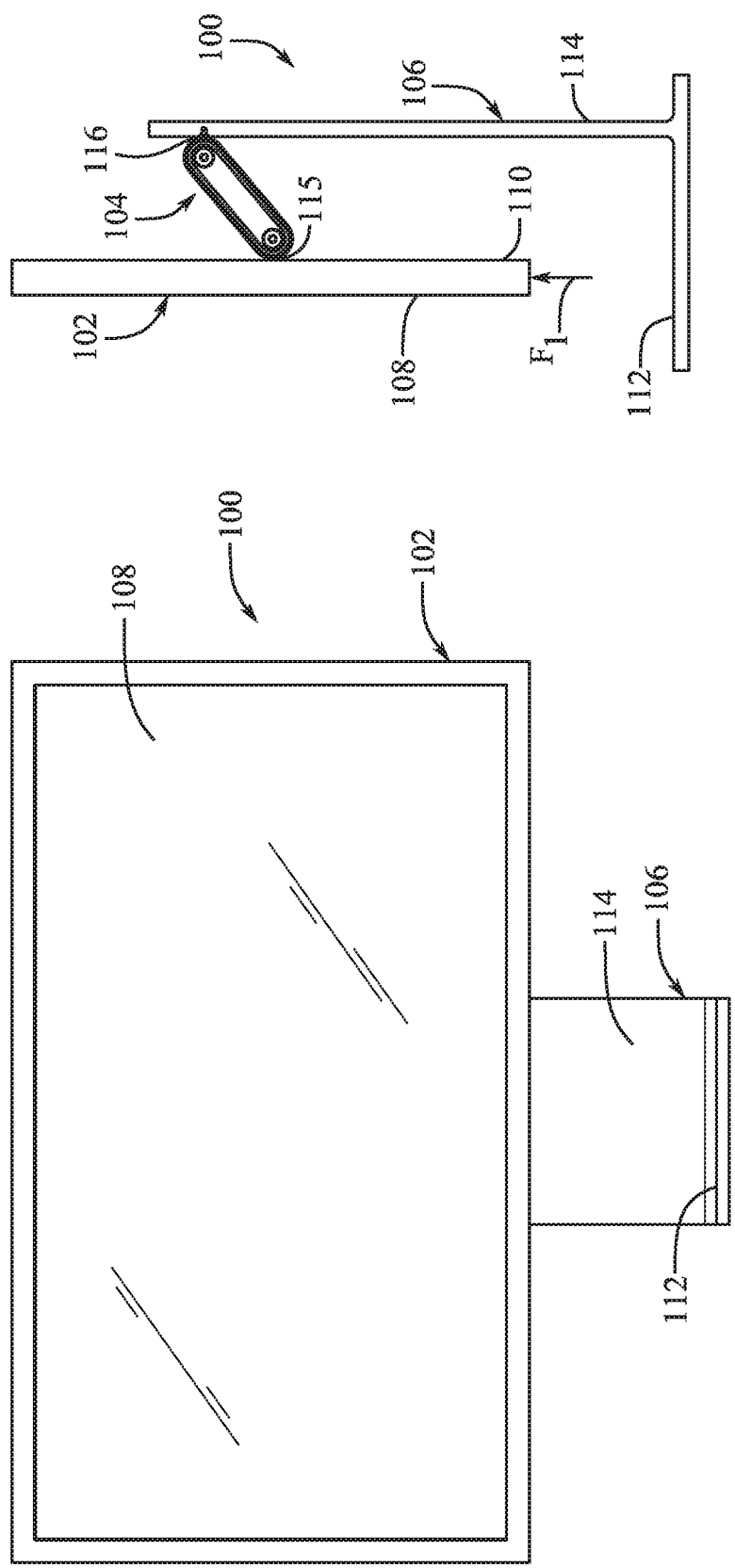

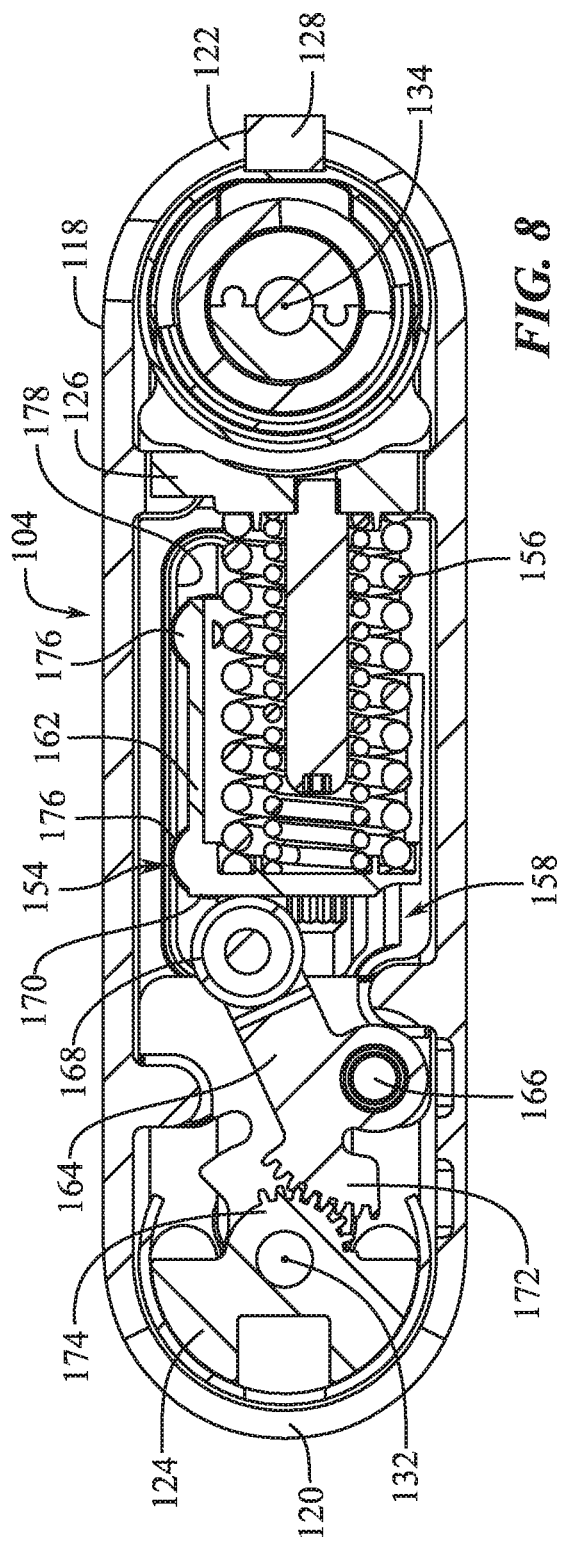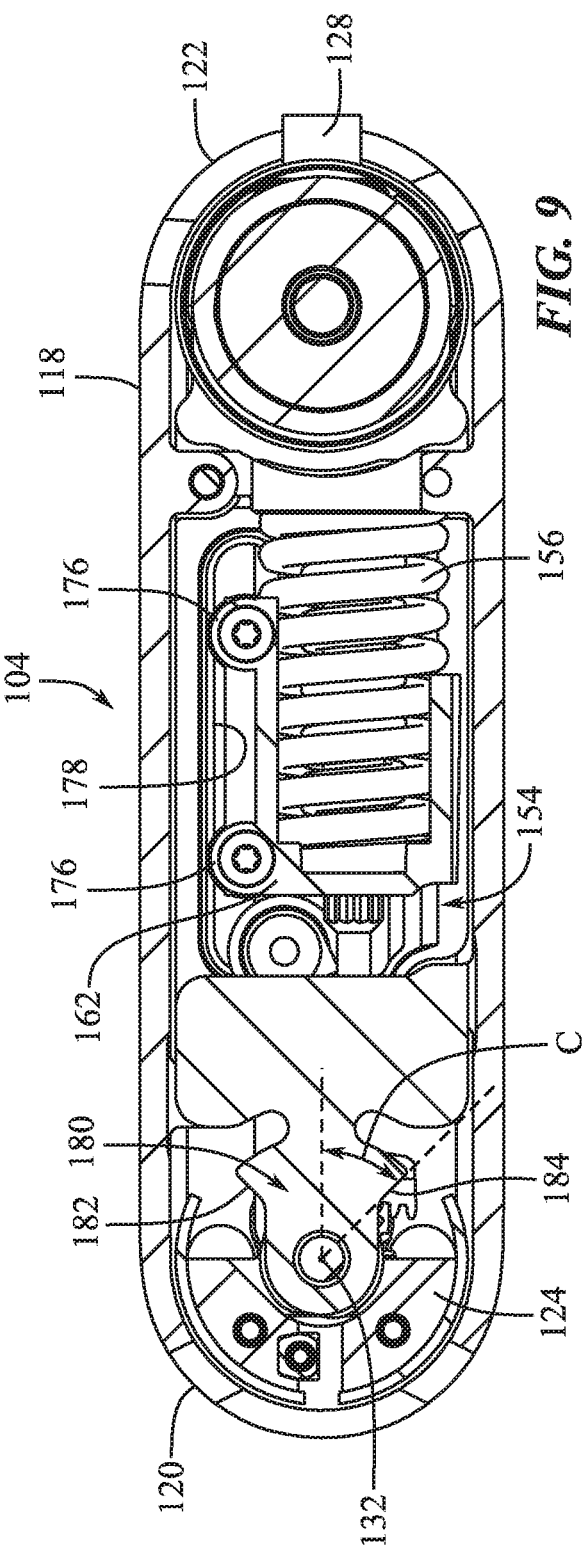

DISPLAY LIFT ARM

CROSS-REFERENCE TO RELATED APPLICATION(S)

This claims priority to U.S. Provisional Patent Application No. 62/855,315, filed 31 May 2019, and entitled "DISPLAY LIFT ARM," the entire disclosure of which is hereby incorporated by reference.

FIELD

The described embodiments relate generally to stands and supports for electronic devices. More particularly, these embodiments relate to counterbalanced arm supports for a computer display.

BACKGROUND

Computer device designers often desire to control positioning of a computer monitor or similar display at whatever height and orientation is best suited for the needs of the user. Support stands are used to position the display to accommodate users and desktop surfaces of different heights, sizes, and postures. Support stands can also allow users to adjust the positioning of the monitor with little expended effort.

While various existing display stands provide tilt, rotation, and vertical height adjustment of monitors, these features often come at the expense of being convenient and natural to use. Many require the user to deal with significant friction or hysteresis that makes adjustment difficult, awkward, and time consuming. Such issues impede the stand from having a high quality, and make the stand more difficult to provide a satisfactory user experience. There is, therefore, a constant need for improvements to stands and supports for electronic devices.

SUMMARY

One aspect of the disclosure relates to a display assembly comprising an electronic display, an arm linkage, and a counterbalance mechanism. The arm linkage can include a first end support attachable to a support surface, a second end support coupled to the electronic display, a first bar attached to a first pivot point on the first end support and to a second pivot point on the second end support, and a second bar attached to a third pivot point on the first end support and to a fourth pivot point on the second end support. The first, second, third, and fourth pivot points can form a parallelogram. The counterbalance mechanism can include an energy storage device and a block coupled to the energy storage device, wherein movement of the electronic display can respectively rotate the first and second bars about the first and third pivot points and translate the block to change a potential energy of the energy storage device. The change in the potential energy of the energy storage device can be equal to a change in potential energy of the electronic display caused by the movement of the electronic display.

The display assembly can further comprise a housing containing the arm linkage and the counterbalance mechanism, wherein the counterbalance mechanism comprises a rotatable member having a follower end contacting the block, with the rotatable member being configured to pivot in response to the movement of the electronic display and to induce translation of the block, and a display stand extending below the housing, with the support surface being positioned on the display stand. The second and fourth pivot points can be stationary relative to each other during the movement of the electronic display relative to the display stand.

In various embodiments, the support surface can be part of a display stand. The block can engage a counterbalance linkage to convert rotational movement of the arm linkage into translation of the block. The counterbalance linkage can convert rotational movement of the arm linkage into rotation of a member of the counterbalance linkage. The rotational movement of the arm linkage can be converted into rotation of the member at a 2:1 ratio. The block can be part of a Scotch yoke.

Another aspect of the disclosure relates to a display support comprising a base, an arm extending from the base, with the arm including a first end member having a first lateral axis, a second end member having a second lateral axis, and a linkage coupling the first end member to the second end member, wherein the second end member is vertically translatable relative to the first end member without the first or second end members rotating about their respective first or second lateral axes, and an energy storage structure that increases stored energy proportional to downward movement of the second end member and that decreases stored energy proportional to upward movement of the second end member.

In some embodiments, the energy storage structure can be positioned in the arm. The display support can comprise weight coupled to the second end member, wherein the energy storage structure stores or releases energy in a quantity equal to a quantity of a change in potential energy of the weight. The first end member can comprise a first gear surface, and the energy storage structure can comprise a second gear surface engaging the first gear surface. The first and second gear surfaces can induce rotation of a portion of the energy storage structure at one-half a rate of rotation of the linkage. The energy storage structure can comprise a block and a biasing member, with the biasing member storing energy in response to movement of the second end member and with the biasing member applying a force to the block.

Yet another aspect of the disclosure relates to an electronic display assembly comprising an electronic display having a front-facing viewing surface, a stand, a linkage coupled to the stand through a vertical axis, with the linkage being coupled to the electronic display, and a counterbalance assembly having a biasing member and a counterbalance mechanism to change potential energy stored in the biasing member. Application of a force to the electronic display can pivot the linkage relative to the stand and relative to the electronic display with the front-facing viewing surface being parallel to the vertical axis, and application of the force can rotate the counterbalance mechanism to change an amount of potential energy stored in the biasing member equal to an amount of changed potential energy of the electronic display.

In some embodiments, the counterbalance mechanism comprises a four-bar linkage or comprises a block coupled to the biasing member, wherein rotation of the linkage relative to the stand translates the block. The counterbalance mechanism can comprise enmeshed gears. The linkage can be a four-bar linkage. The counterbalance assembly can be positioned between the electronic display and the stand.

BRIEF DESCRIPTION OF THE DRAWINGS

The disclosure will be readily understood by the following detailed description in conjunction with the accompanying drawings, wherein like reference numerals designate like structural elements, and in which:

FIG. 1 shows a front view of a display assembly with a display in a lowered position.

FIG. 2 shows a side view of the assembly of FIG. 1.

FIG. 8 shows a side section view of the support arm of FIG. 7 as taken through section lines 8-8 in FIG. 7.

FIG. 9 shows a side section view of the support arm of FIG. 7 as taken through section lines 9-9 in FIG. 7.

DETAILED DESCRIPTION

Figure 4:
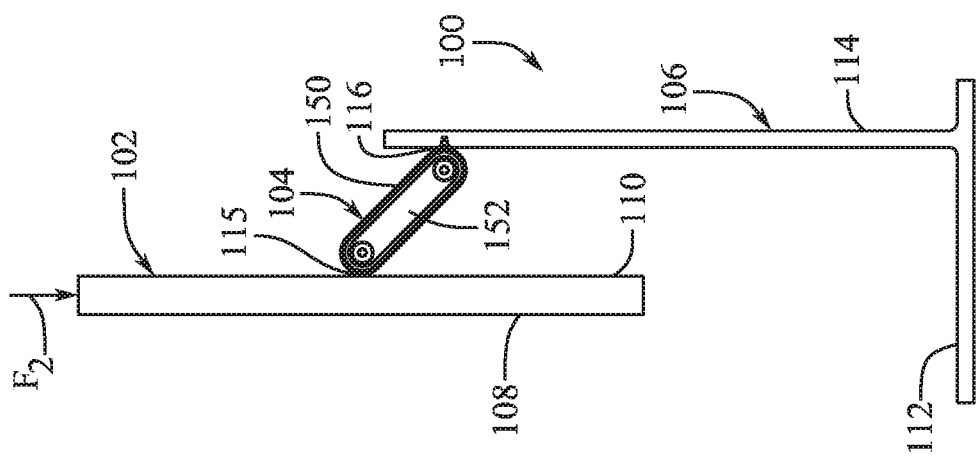
FIG. 4 shows a side view of the assembly of FIG. 3.

Reference will now be made in detail to representative embodiments illustrated in the accompanying drawings. It should be understood that the following descriptions are not intended to limit the embodiments to any preferred embodiment. To the contrary, it is intended to cover alternatives, modifications, and equivalents as can be included within the spirit and scope of the described embodiments as defined by the appended claims.

The following disclosure relates to a counterbalanced support arm device using a Scotch yoke to adjust potential energy in at least one biasing member counterbalance which has a constant spring rate. The energy of the system can be balanced at all times, such that when the display is moved down and accordingly loses potential energy, additional, equal energy is stored in the potential energy of the biasing member. The biasing member can be compressed or expanded as the potential energy of the display changes, and the compression or expansion can be provided by contact between the biasing member and a translatable yoke or block structure that has its translation driven by a rotating shaft in the Scotch yoke.

In some embodiments, the angular rate of movement of the Scotch yoke is two times the rotation of the display support arm. Therefore, when the arm is in a completely vertically upward-extending orientation, the Scotch link is also vertically upward-extending, and as the arm moves down to a vertically downward-extending orientation (e.g., 180 degrees rotated relative to the upward-extending orientation), the Scotch yoke travels 90 degrees while storing energy in the biasing member (e.g., compressing the spring). The rate of compression of the biasing member can be matched with the simple harmonic motion of the mass of the display. See FIG. 21. In some embodiments, the support arm can have a total range of motion of about 80 degrees (i.e., about 40 degrees upward relative to a horizontal configuration and about 40 degrees downward relative to the horizontal configuration), about 60 degrees, about 90 degrees, about 120 degrees, about 150 degrees, about 180 degrees, or a range fitting between any of these ranges of motion.

In various embodiments, the Scotch yoke can be driven by a 2:1 gear ratio between geared surfaces or by a 2:1 rate of angular rotation between a linkage arm in a four-bar linkage arrangement of the support arm and a linkage arm that is part of the Scotch yoke. The Scotch yoke can provide maximum torque when the support arm is in a horizontal configuration and can provide reduced torque (i.e., there is torque falloff relative to the torque at the horizontal configuration) in both raised and lowered configurations.

The support arm can hold the display at a constant tilt angle relative to a support surface or base of the stand as the arm rotates. For example, a four-bar linkage can be integrated into the arm in a manner that preserves parallel motion of a first vertical plane through one end of the four-bar linkage (e.g., through a pair of pivot points for bars of the four-bar linkage in one end support structure) and a second vertical plane through an opposite end of the four-bar linkage (e.g., through a pair of pivot points for the bars in a second end support structure). Accordingly, the support arm can have a yoked counterbalance that is referenced by a four-bar linkage or similar parallel-motion device. In some embodiments, an end of the support arm can also provide tilt to an attached display (i.e., rotation of the display about the end of the support arm connected to the display).

In some embodiments, the counterbalance mechanism is positioned in a housing in the support arm between a support surface and the electronic display. The counterbalance mechanism can also be positioned in a support structure external to the display and the support arm, such as by being positioned in a stand structure that supports the end of the support arm positioned opposite the electronic display.

The combination of a counterbalance with 1:1 potential energy conversion and parallel movement of the ends of the support arm can provide improved smooth and precise adjustment motion of the electronic display between vertical positions. The input force required to adjust the display can also be constrained to desired levels because the counterbalance does not necessarily use friction to store energy or to prevent movement of the support arm. Accordingly, friction in the pivotable portions of the support arm (e.g., friction disks in the four-bar linkage) can be designed to provide a desired amount of resistance to adjustment. In this manner, the motion of the support arm can be smooth and have minimized hysteresis. Additionally, the display-coupled end of the support arm can be attached to a pivoting member configured to permit the display to tilt relative to the display-coupled end of the support arm without causing the display-coupled end to move or rotate on its own.

These and other embodiments are discussed below with reference to the figures. However, those skilled in the art will readily appreciate that the detailed description given herein with respect to these figures is for explanatory purposes only and should not be construed as limiting.

Figure 3:
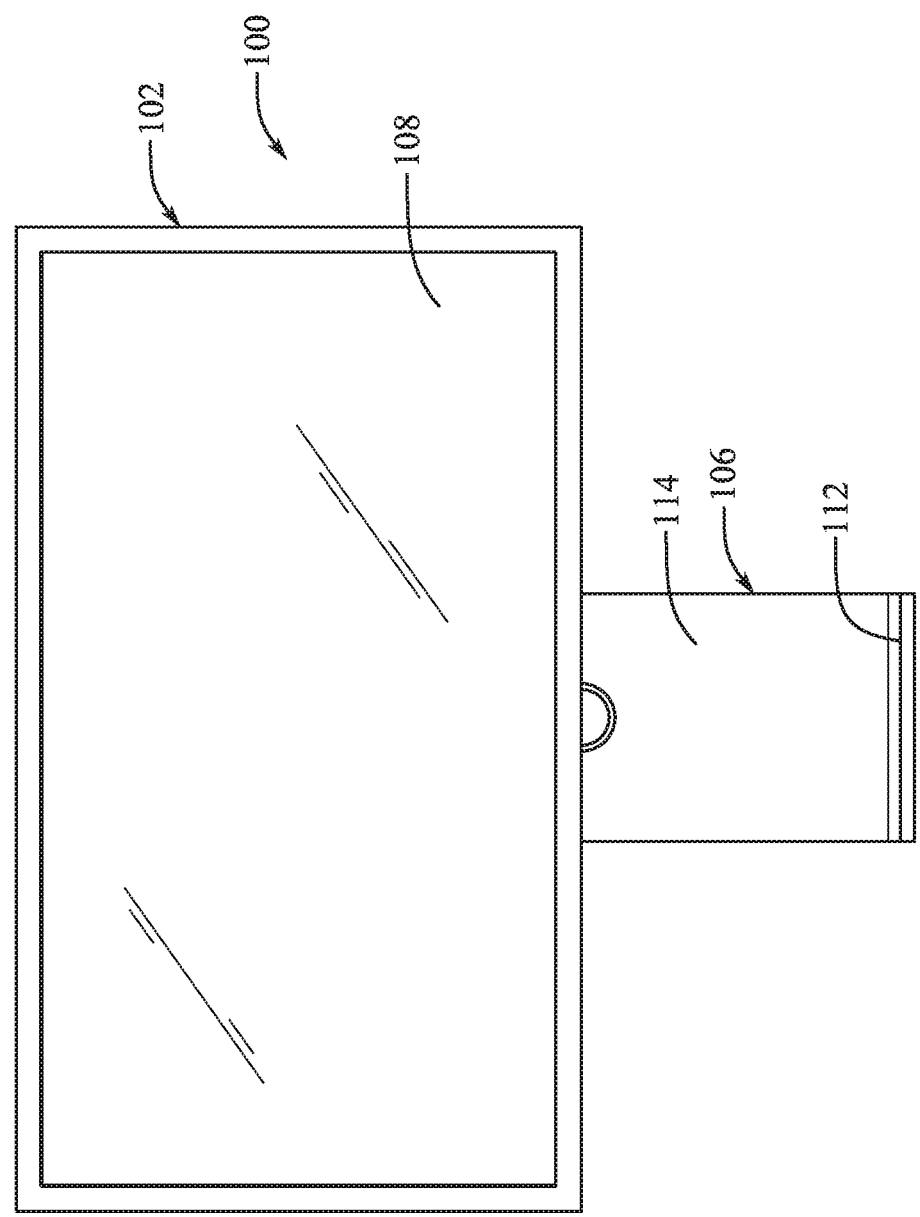
FIG. 3 shows a front view of the assembly of FIG. 1 with the display in a raised position.

FIGS. 1-15 show various aspects of a display assembly 100. FIG. 1 illustrates a front view and FIG. 2 shows a right side view of an electronic display 102 coupled to a support arm 104 that is coupled to a stand 106. FIGS. 3-4 show the display 102 coupled to the support arm 104 in a raised position relative to the configuration shown in FIGS. 1-2.

The display assembly 100 can be a standalone assembly wherein the support arm 104 and stand 106 are configured to support the weight of a single display 102. In some embodiments, the display assembly 100 can omit the stand 106, and the support arm 104 can be coupled to another support surface or ground surface such as, for example, a vertical wall, a horizontal rail extending laterally across the width the display 102 and behind the display 102, or another similar structure. See FIG. 16 at element 1601.

The display 102 can comprise an electronic display such as a monitor or similar visual output device for displaying information in pictorial form. The display 102 can comprise a display device (e.g., a thin film transistor liquid crystal display (TFT-LCD) with light-emitting diode (LED) or cold-cathode fluorescent lamp (CCFL) backlighting or an organic light-emitting diode (OLED) display), circuitry, a housing or casing, and a power supply. The display 102 can be configured to connect to a computer using connectors and ports such as a digital visual interface (DVI) connector, DISPLAYPORT® connector, THUNDERBOLT® connector, or other related or similar electrical interfaces.

The display 102 can comprise a front-facing surface 108 configured to face and display information to the user for viewing. Thus, the front-facing surface 108 can be referred to as a viewing surface. The front-facing surface 108 can be substantially planar/flat or curved (e.g., cylindrically concave or convex). The display 102 can comprise a rear-facing surface 110 configured to face away from the user. The support arm 104 can be positioned between the rear-facing surface 110 and the stand 106. The support arm 104 can be releasably coupled to the display 102 at the rear-facing surface 110 or in rear side portions of the display 102. In some embodiments, the support arm 104 can be attached to the display 102 at a display attachment point 115.

The support arm 104 can also be coupled to the stand 106. The stand 106 can comprise a base 112 configured to extend underneath the display 102 and can comprise a vertical support 114 configured to extend upward from the base 112 and behind the rear-facing surface 110 of the display 102. The vertical support 114 can have a top end at which the support arm 104 is attached at a stand attachment point 116. The stand 106 can therefore be referred to as having a generally L-shaped profile with the display 102 being positioned above a base portion 112 of the L-shape, as shown in FIGS. 2 and 4.

The support arm 104 can hold the display 102 in place relative to the stand 106 and can keep the display 102 in a user-selected vertical position relative to the stand 106. The support arm 104 can retain the display in multiple different positions including a lowered position (as shown in FIGS. 1-2) and a raised position (as shown in FIGS. 3-4) with the position of the display 102 remaining static (i.e., without drifting or sagging downward due to the weight of the display 102 pulling down on the support arm 104). A user can provide an input force oriented in a vertical direction to raise the display 102 relative to the stand 106, as indicated by force $F_1$ in FIG. 2, or the user can provide a vertically-oriented input force F2 to lower the display 102 relative to the stand 106, as shown in FIG. 4. As the display 102 moves, it can travel through an arc-shaped path with a radius defined by the length of the support arm 104. See FIGS. 10-15 and their related descriptions below.

FIGS. 5-9 show views of a support arm 104 according to an embodiment of the present disclosure. The support arm 104 can comprise a housing 118 having a first end 120 and a second end 122. The first end 120 can be positioned adjacent to the stand 106 (relative to the second end 122), and the second end 122 can be positioned adjacent to the display 102 (relative to the first end 120). The housing 118 can comprise a smooth, hard outer surface and can comprise a rigid material such as a rigid metal, ceramic, or plastic. The support arm 104 can comprise a generally elongated shape with flat side surfaces and curved end surfaces. In FIGS. 5-9, the support arm 104 is shown with some side surfaces of the housing 118 omitted in order to show internal components of the support arm 104.

Within the housing 118, the support arm 104 can comprise a first end support 124 positioned in the first end 120 and a second end support 126 positioned in the second end 122. See FIGS. 5-7. The first end support 124 can be coupled to the stand 106 or another support surface external to the support arm 104. The second end support 126 can be coupled to the display 102 or to a display mounting apparatus 128 positioned at the second end 122 of the housing 118. The display mounting apparatus 128 can be attached to an intermediate display connector 130. The intermediate display connector 130 can be an element configured to attach to the display 102, such as a magnetic element that is magnetically attracted to the display 102 or an interlocking element configured to mechanically interlock with a portion of the display 102. The housing 118 can be rotatable relative to the first and second end supports 124, 126 about a pair of pivot axes 132, 134 shown in FIGS. 5, 6, and 8.

Figure 10:
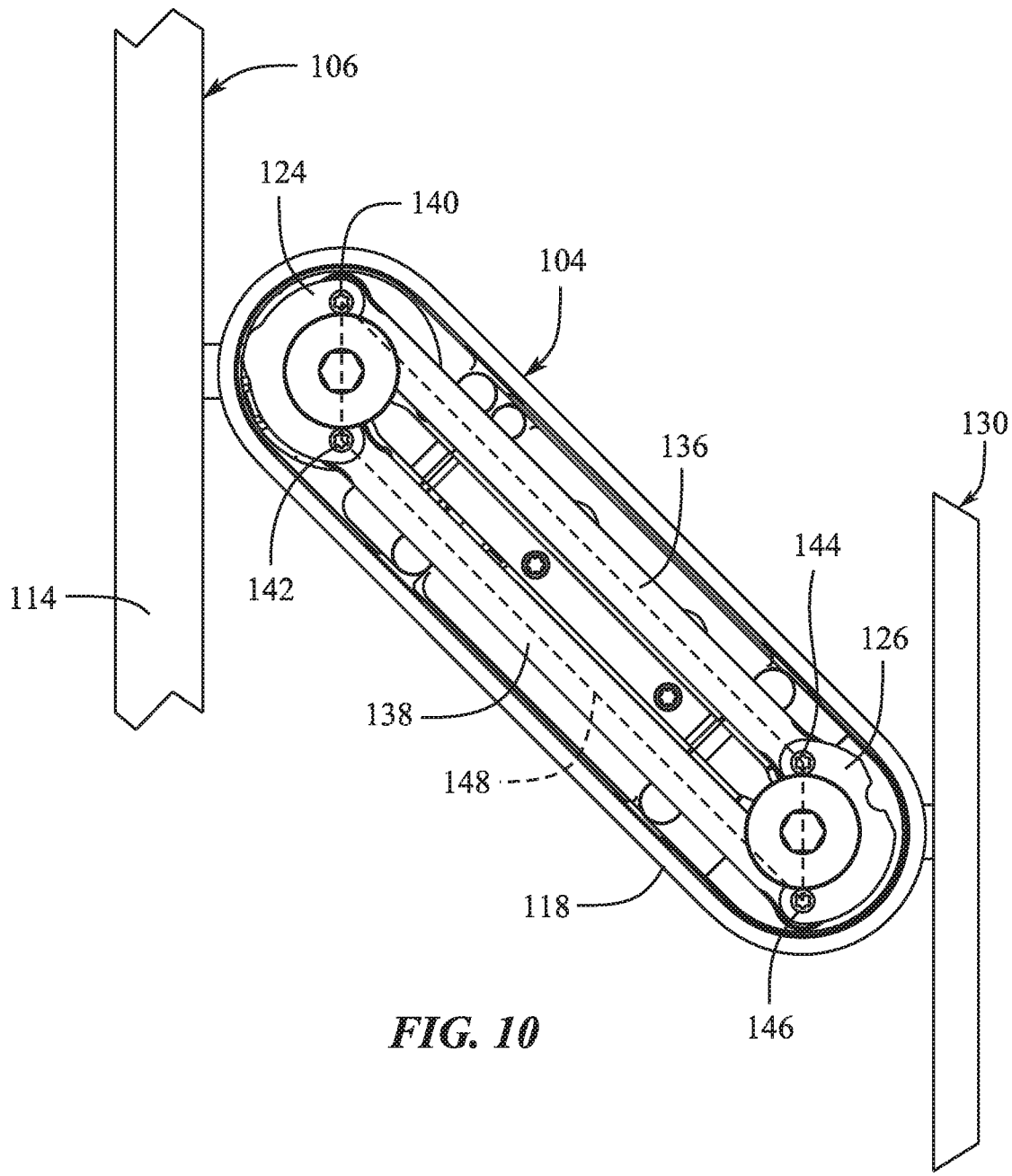
FIG. 10 shows a side view of a display assembly in a lowered position.
Figure 12:
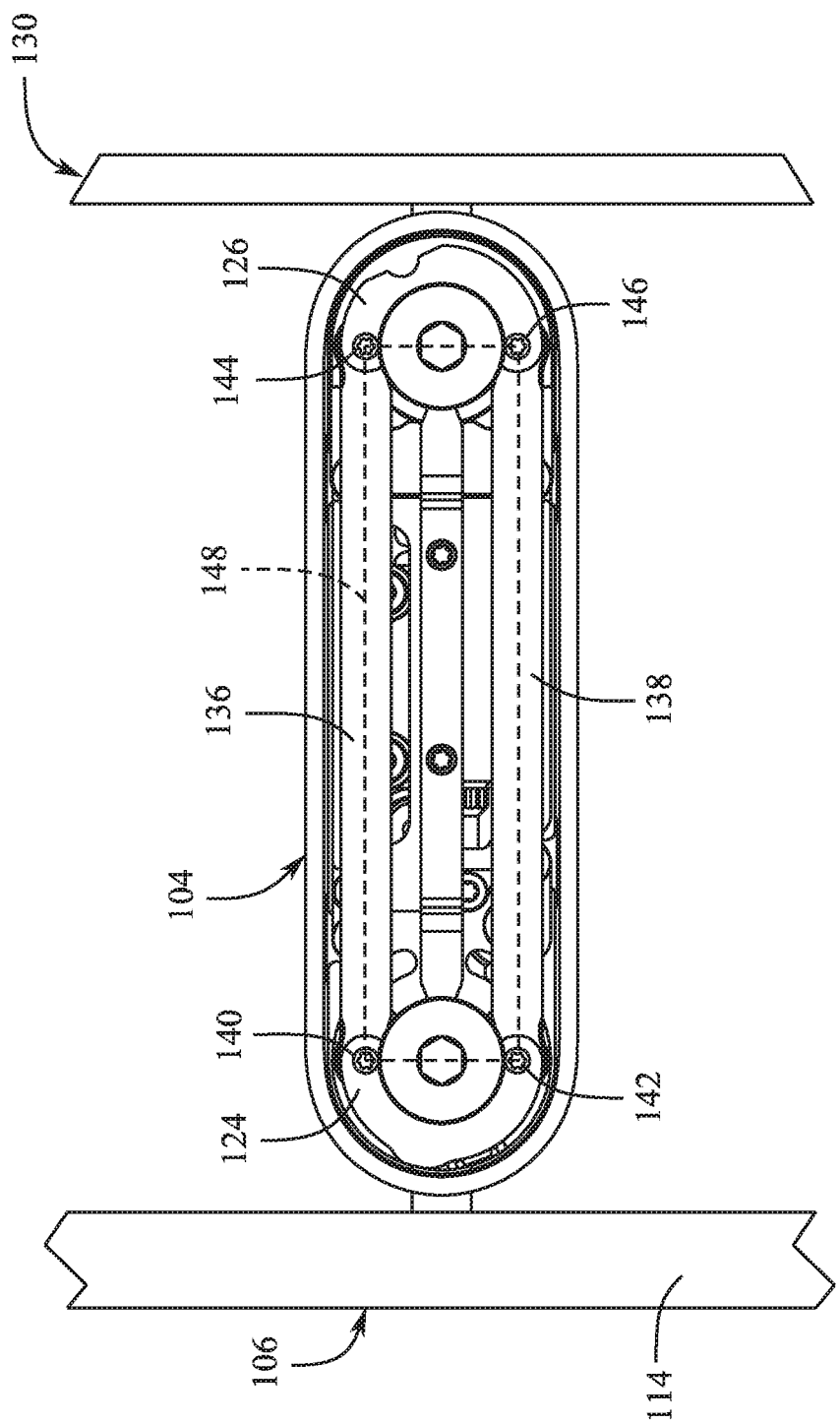
FIG. 12 shows a side view of the display assembly of FIG. 10 in a horizontal position.
Figure 14:
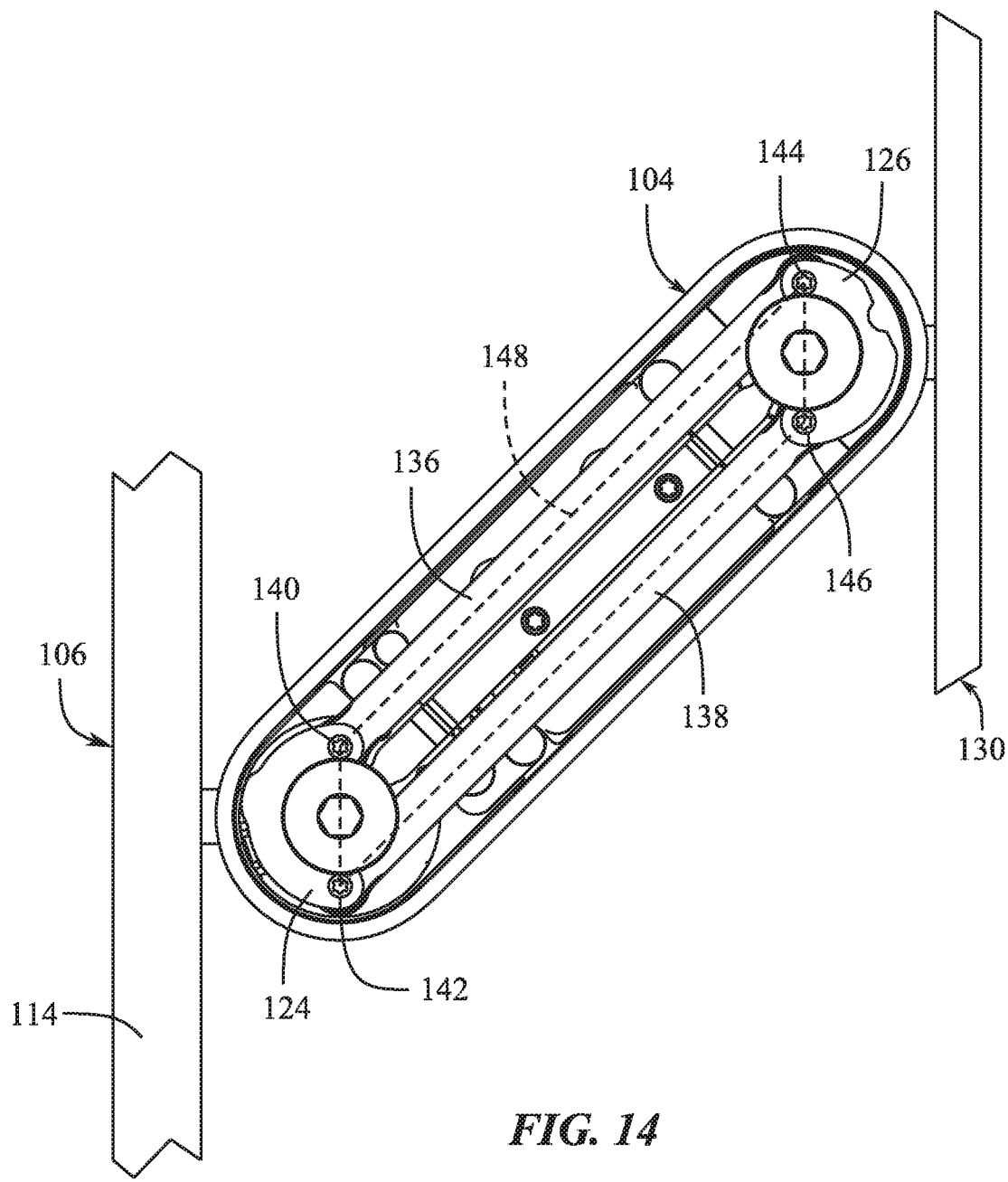
FIG. 14 shows a side view of the display assembly of FIG. 10 in a raised position.

A first bar 136 and second bar 138 can be attached to pivot points 140, 142 on the first end support 124 and can be attached to pivot points 144, 146 on the second end support 126. The first and second bars 136, 138 can be pivotable relative to their respective connected pivot points 140, 142, 144, 146. The first and second bars 136, 138 can have equal lengths between the pivot points. For example, the first bar 136 can have a length between pivot points 140 and 144 that is equal to a length of the second bar 138 between pivot points 142, 146. The first and second bars 136, 138 can be arranged parallel to each other in the lowered, horizontal, and raised positions (i.e., the positions of FIGS. 10, 12, and 14, respectively). Accordingly, the distance between the pivot points 140, 142 on the first end support 124 can be equal to the distance between the pivot points 144, 146 on the second end support 126. The four pivot points 140, 142 can therefore define corners of a quadrilateral parallelogram 148, as shown in FIGS. 10, 12, and 14.

An input force applied to the display 102 (e.g., $F_1$ or $F_2$) or to the support arm 104 can cause the first and second bars 136, 138 to rotate relative to the first end support 124 with axes of rotation through pivot points 140, 142. The first and second bars 136, 138 are also rotatably attached to the second end support 126, so the rotation of the bars 136, 138 at the first end support 124 also induces equal magnitude rotation at the second end support 126 about its associated pivot points 144, 146. For this reason, a line extending through the first end support pivot points 140, 142 is always parallel to a line extending through the second end support pivot points 144, 146. The parallel movement of the nearby pairs of pivot points 140/142, 144/146 ensures that the display 102 does not rotate relative to the display mounting apparatus 128 or the display connector 130 as the support arm 104 moves about the pivot axis 132 between the positions shown in FIGS. 10, 12, and 14. The first end pivot points 140, 142 can be stationary relative to each other as the bars 136, 138 rotate, and the second end pivot points 144, 146 can also be stationary relative to each other as the bars 136, 138 rotate. In some embodiments, the display mounting apparatus 128 can rotate about the second pivot axis 134 independent of the housing 118 and independent of the second end support 126 in a manner that allows the display 102 to tilt without moving the support arm 104.

The first and second bars 136, 138 can be referred to as being part of a four-bar linkage or a four-link, four-joint, closed-loop linkage. The first and second bars 136, 138 can be two of the links in the four-bar linkage, and the first and second end supports 124, 126 can be the remaining two links. The first and second bars 136, 138 can rotate without translating relative to each other, and the first and second end supports 124, 126 can translate relative to each other without rotating relative to each other.

Figure 5:
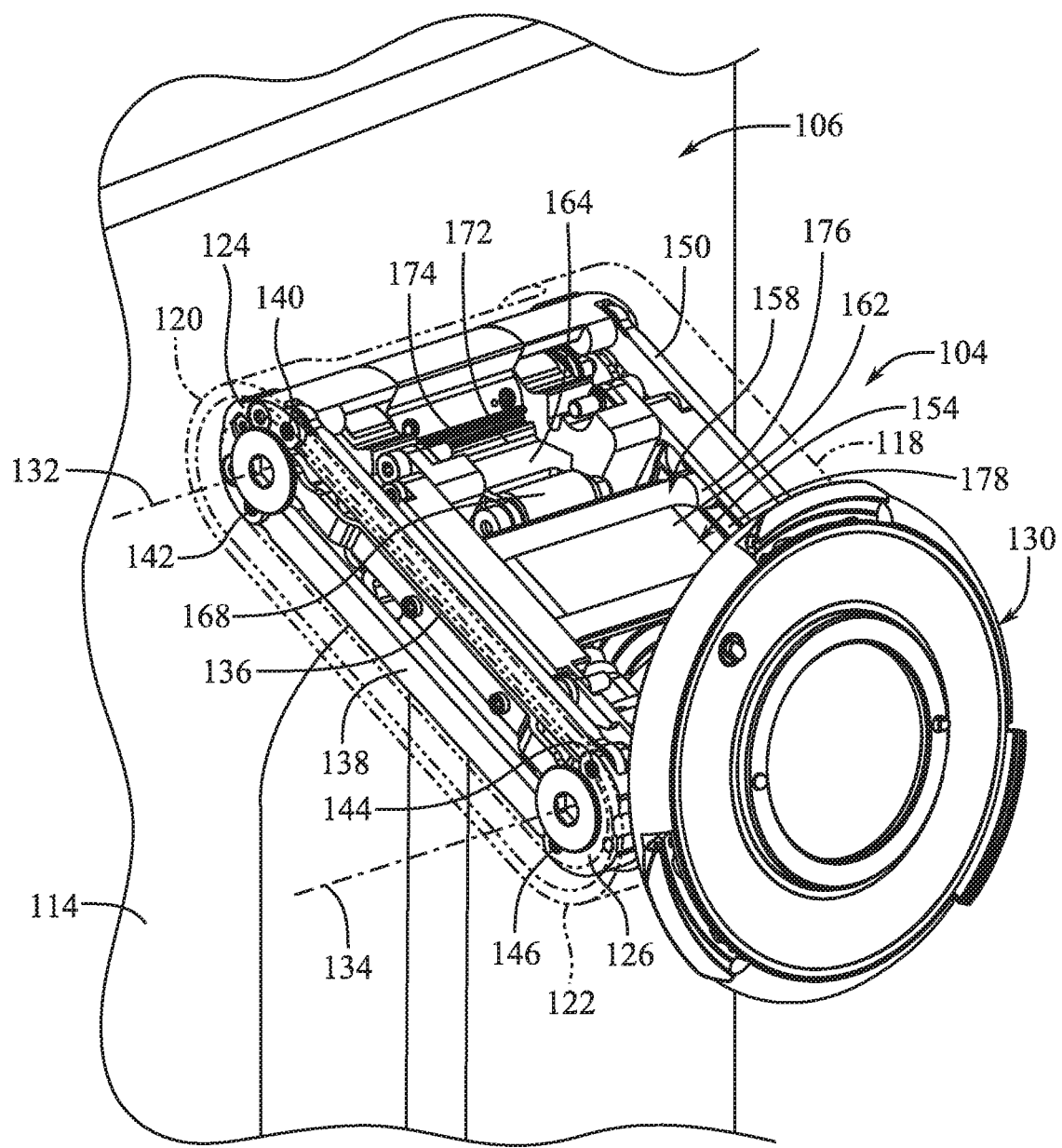
FIG. 5 shows an isometric view of a support arm and stand.
Figure 6:
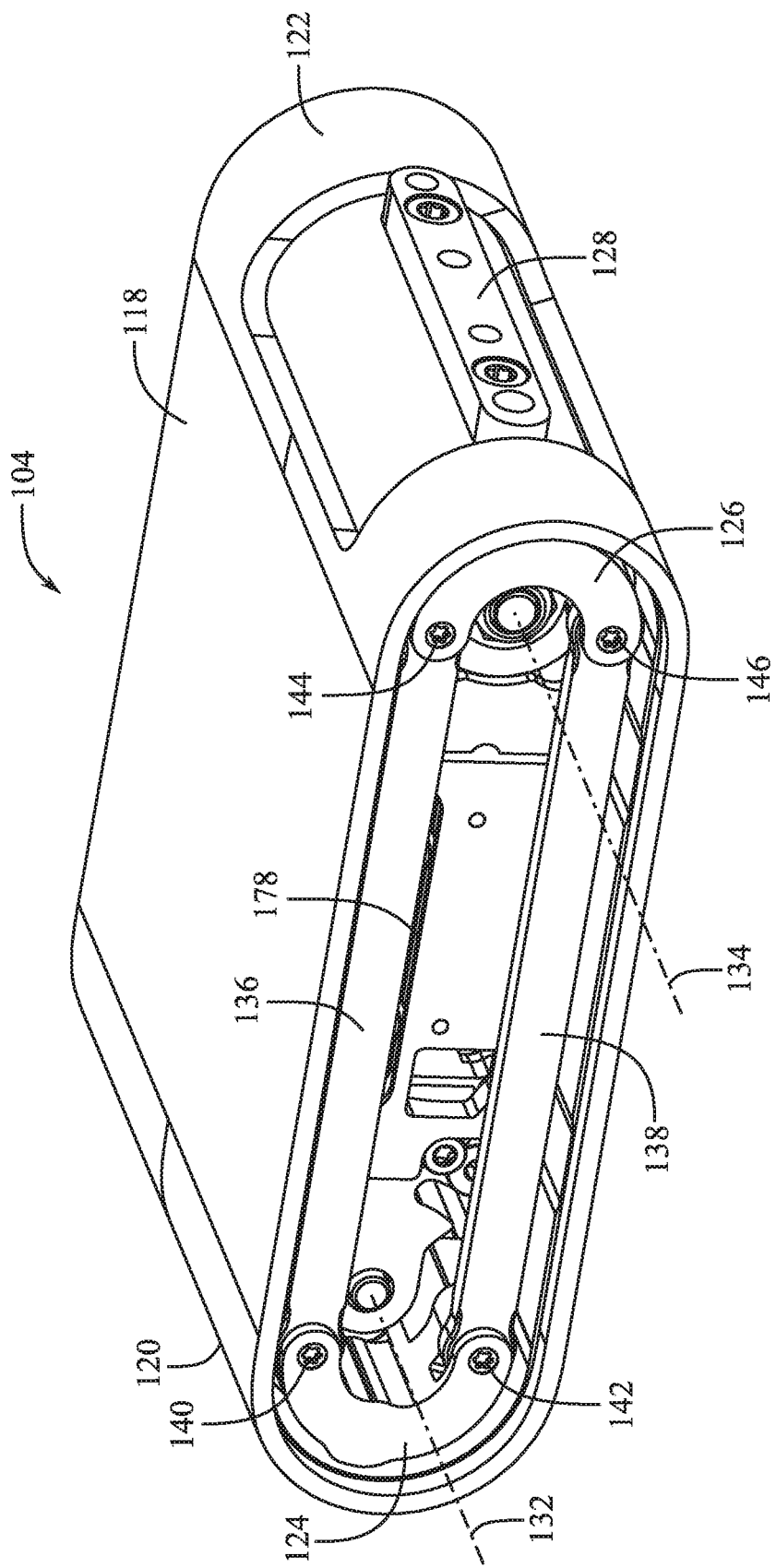
FIG. 6 shows an isometric view of a support arm.
Figure 7:
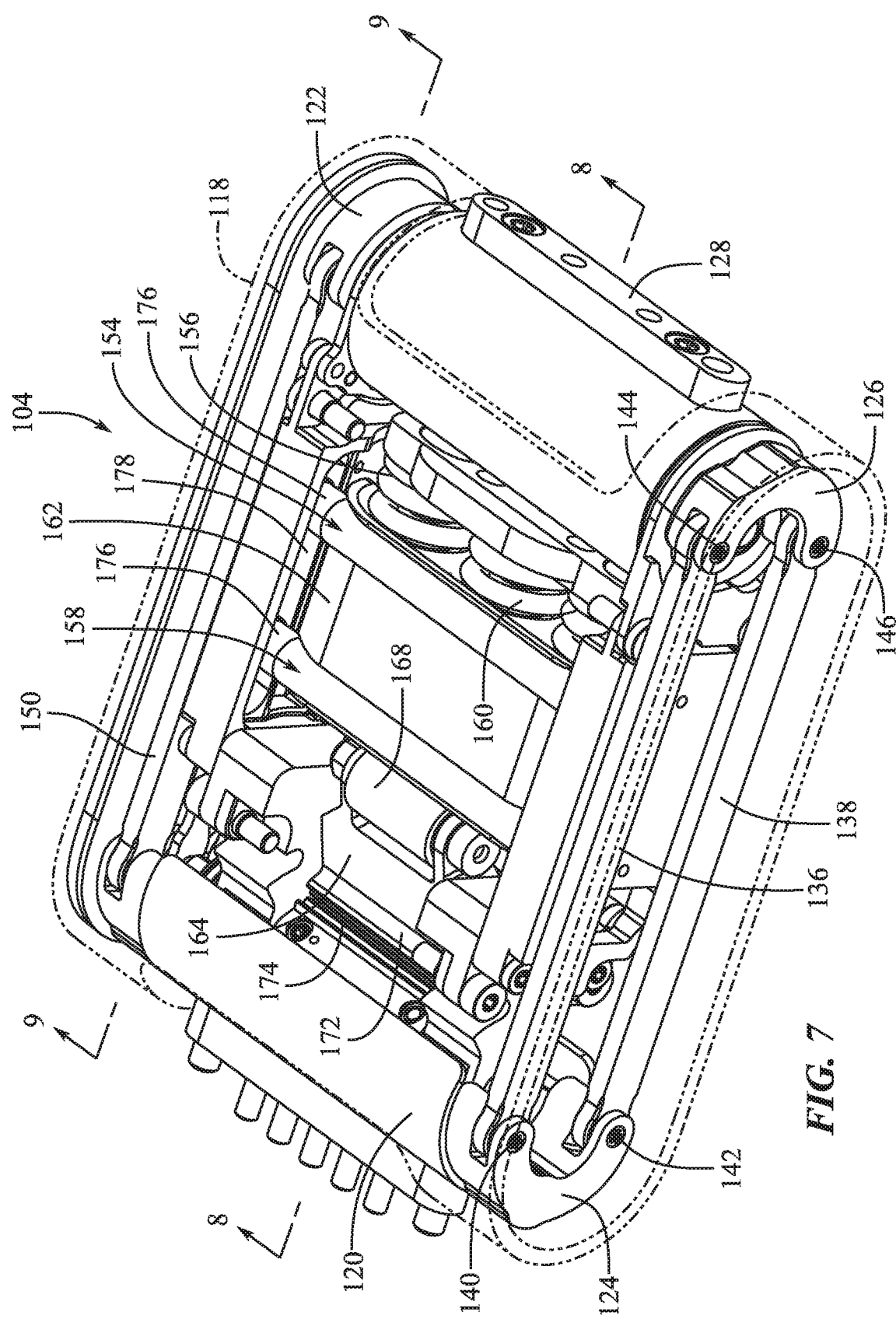
FIG. 7 shows another isometric view of a support arm.

The support arm 104 can comprise at least one four-bar linkage. In some embodiments, a four-bar linkage is positioned at different points within the housing 118. For example, as shown in FIGS. 4, 5, and 7, a third bar 150 and a fourth bar 152 can be provided in the housing 118 on a side opposite the first and second bars 136, 138. In some embodiments, the multiple four-bar linkages can be constructed with entirely separate links or bars. In some cases, four-bar linkages can share links or bars, such as how the third and fourth bars 150, 152 are pivotally connected to the same first and second end supports 124, 126 as the first and second bars 136, 138. See FIGS. 5 and 7.

The interior of the housing 118 can also comprise a counterbalance mechanism 154 (i.e., a counterbalance assembly or energy storage structure). The counterbalance mechanism 154 can comprise at least one energy storage device 156 and at least one yoke 158. The counterbalance mechanism 154 can be configured to internally store or release potential energy as the potential energy of the display 102 changes in response to upward or downward movement.

The energy storage device 156 can comprise one or more springs (e.g., elastically compressible coils, gas springs, elastomeric materials, elastically extendable coils, gravitationally displaceable weights, cables, and pulleys, similar devices, and combinations thereof). In some embodiments, springs are positioned in a side-by-side configuration which can reduce the vertical thickness of the support arm 104 while still providing significant spring force and energy storage capacity. See energy storage device 160 in FIG. 7.

Figure 20:
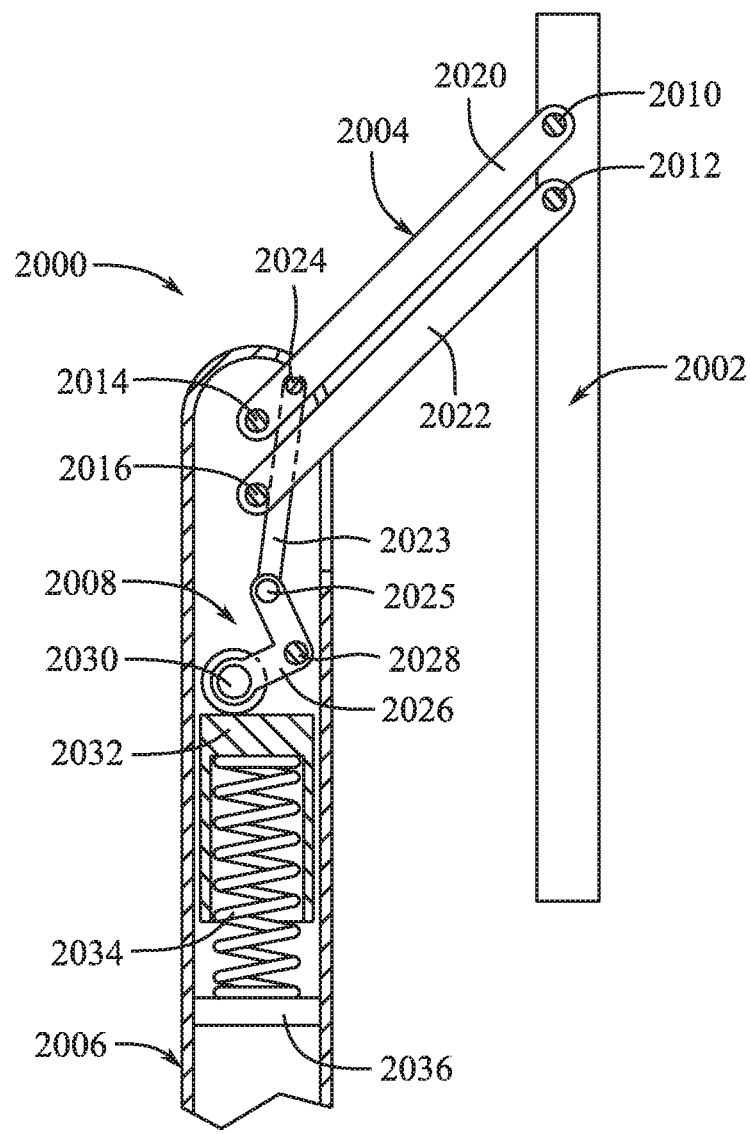
FIG. 20 shows a diagrammatic side view of another embodiment of a display assembly with the display in a raised position.

The energy storage device 156 can be positioned in the support arm 104 or external to the support arm (see FIG. 20). The energy storage device 156 can store energy by being compressed, such as in the case of a compression spring, can store energy by being expanded, such as in the case of an extension spring, or can store energy by being moved, such as in the case of a displaceable weight. The counterbalance mechanism 154 can be configured to ensure that the amount of energy stored in the energy storage device 156 equals the energy lost by moving the display 102 downward and to ensure that the amount of energy lost from the energy storage device 156 equals the energy gained by moving the display 102 upward.

Figure 11:
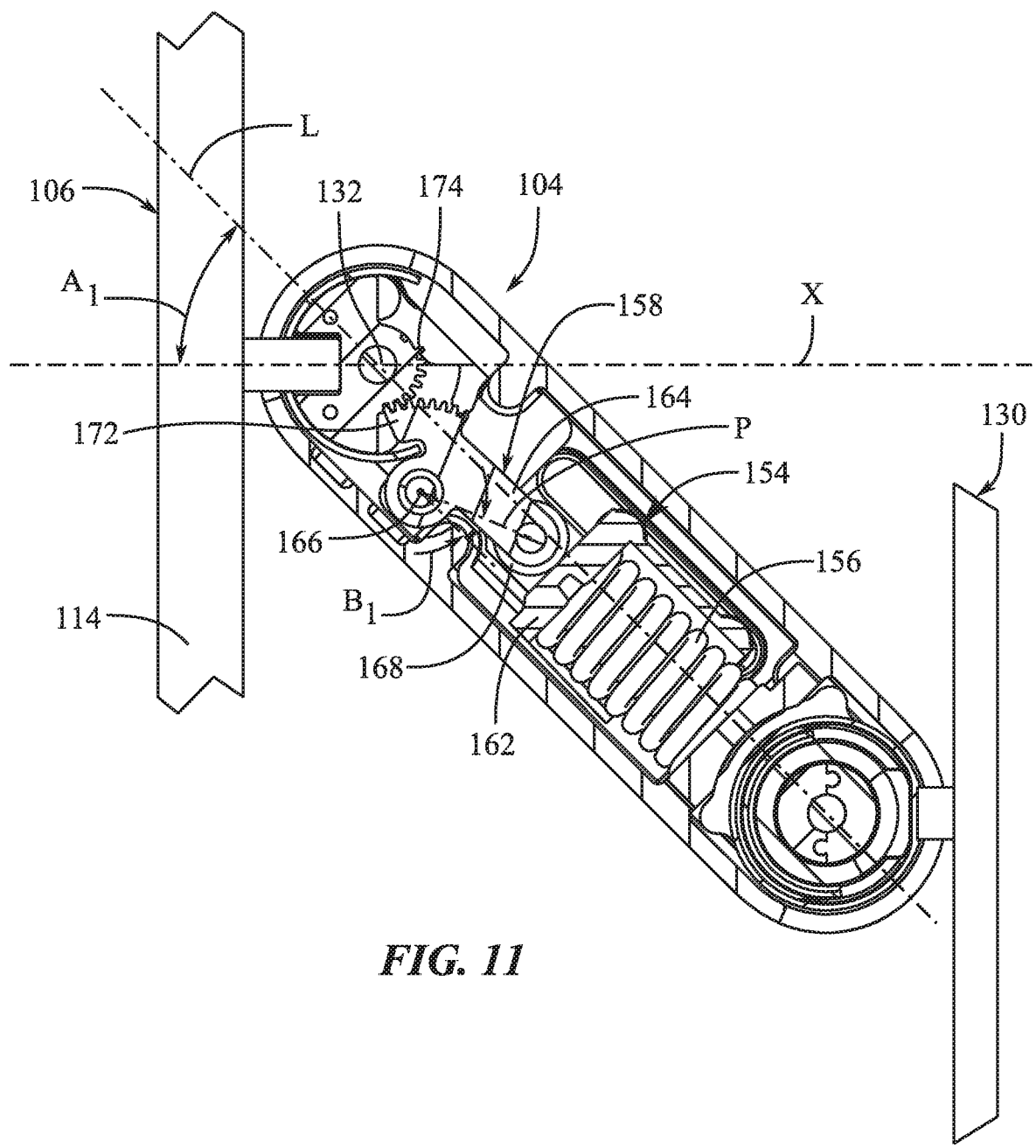
FIG. 11 shows a central side section view of the assembly of FIG. 10.

A compression spring is shown as the energy storage device 156 of FIGS. 5-15, and the spring is shown with maximum compression (i.e., minimum length along the length dimension of the support arm 104) in the lowered position shown in FIG. 11. The spring has less compression in the horizontal position shown in FIG. 13, and has minimum compression in the raised position shown in FIG. 15. Thus, the compression spring stores the most energy in the minimum-height lowered position and stores the least energy in the maximum-height raised position.

The rate of compression or expansion of the energy storage device 156 can be matched to simple harmonic motion of the mass of the display 102. The energy storage device 156 can comprise linear springs with a constant spring rate to provide this behavior. See also FIG. 21 and its related description below.

The energy storage device 156 can have its potential energy adjusted by operation of the yoke 158. The yoke 158 can comprise a translatable block 162 engaging the energy storage device 156 and a counterbalance arm 164 to adjust the position of the block 162. The counterbalance arm 164 can be mounted to the housing 118 at a counterbalance pivot point 166 and can have a follower 168 contacting a surface 170 (see FIG. 8) of the block 162. The follower 168 can be a roller or rounded surface such as a cam follower and can be configured to remain in constant contact with the surface 170. The counterbalance arm 164 can also comprise an arm gear surface 172 configured to engage an end support gear surface 174 of the first end support 124. The yoke 158 can be referred to as a Scotch yoke or a yoke mechanism configured to convert rotational motion of the counterbalance arm 164 into translation motion of the block 162.

Figure 15:
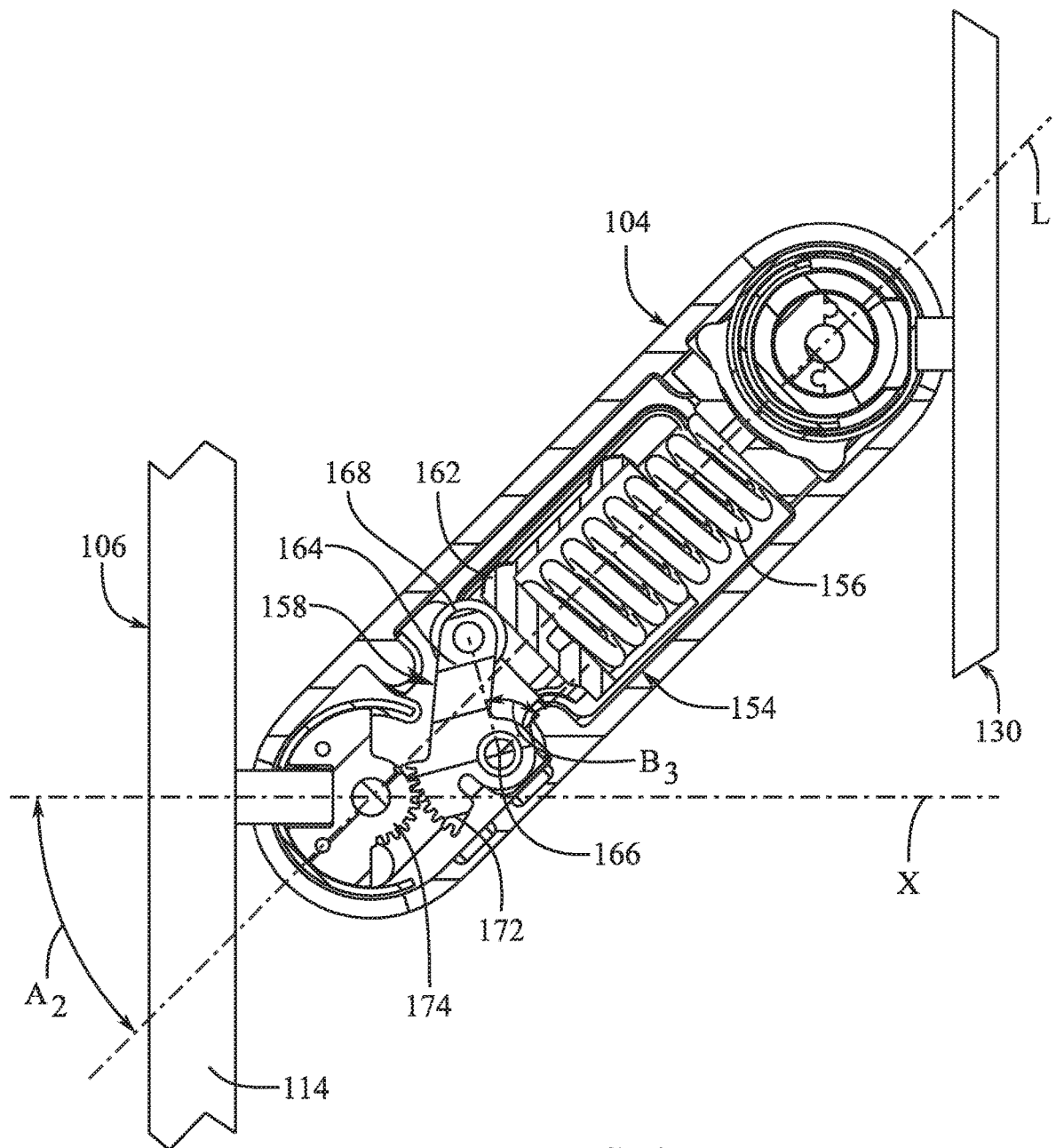
FIG. 15 shows a central side section view of the assembly of FIG. 14.

As the support arm 104 moves, the housing 118 rotates, thereby moving the counterbalance pivot point 166 relative to the pivot axis 132 that extends through the first end support 124. See FIG. 8. The engagement of the gear surfaces 172, 174 causes the counterbalance arm 164 to rotate about the pivot point 166, thereby driving the follower 168 through an arc-shaped path about the pivot point 166. The longitudinal position of the follower 168 (i.e., the position of the follower along the longitudinal axis L (see FIG. 11) of the housing 118) therefore changes as the housing 118 rotates. At the minimum lowered position of the support arm 104, the follower 168 is at a maximum longitudinal displacement away from the pivot axis 132, as shown in FIG. 11. At the maximum raised position of the support arm 104, the follower 168 is at a minimum longitudinal displacement from the pivot axis 132, as shown in FIG. 15. Due to the arc-shaped path of the follower 168 moving around the pivot point 166, the rate of change of the longitudinal distance between the follower 168 and the pivot axis 132 is lower per degree of rotation of the support arm 104 while the support arm 104 is in a lowered position as compared to the rate of change of the longitudinal distance per degree of rotation of the support arm 104 between the follower 168 and the pivot axis 132 while the support arm 104 is in a raised position. This rate of change is reflected in the periodic, sine-wave-like curvature of the spring potential energy curve 2104 of FIG. 21.

The energy storage device 156 can bias the translatable block 162 toward the pivot axis 132. Therefore, the movement of the follower 168 along the longitudinal axis of the housing 118 toward the pivot axis 132 allows the energy storage device 156 to expand, and movement of the follower 168 toward pivot axis 134 can compress the energy storage device 156. Expansion of the energy storage device 156 can release its potential energy, and its compression can store potential energy. The spring characteristics of the energy storage device 156 can be designed to ensure that a change in potential energy of the energy storage device 156 caused by rotation of the support arm 104 precisely offsets the change in potential energy caused by vertical movement of the mass of the display 102 (and any other components attached to it that also move vertically). See also FIG. 21 and its associated descriptions herein.

The gear ratio between arm gear surface 172 and support gear surface 174 can be designed to provide a 2:1 ratio of angular displacement of the support arm 104 about pivot axis 132 to angular displacement of the counterbalance arm 164 about counterbalance pivot point 166. For example, as shown in FIG. 11, the support arm 104 can have a longitudinal axis L positioned at an angle $A_1$ relative to a horizontal axis X, and the counterbalance arm 164 can have an axis P through the counterbalance pivot point 166 and the center of the follower 168 oriented at an angle $B_1$ relative to an axis parallel to the longitudinal axis L. In various embodiments, the axis P can extend through pivot point 166 and through another single point in the counterbalance arm 164. Angle $A_1$ indicates the support arm 104 is at about a 45-degree angle below the horizontal axis X, and angle $B_1$ indicates that the follower 168 is at about a 30-degree angle relative to the horizontal axis X.

Figure 13:
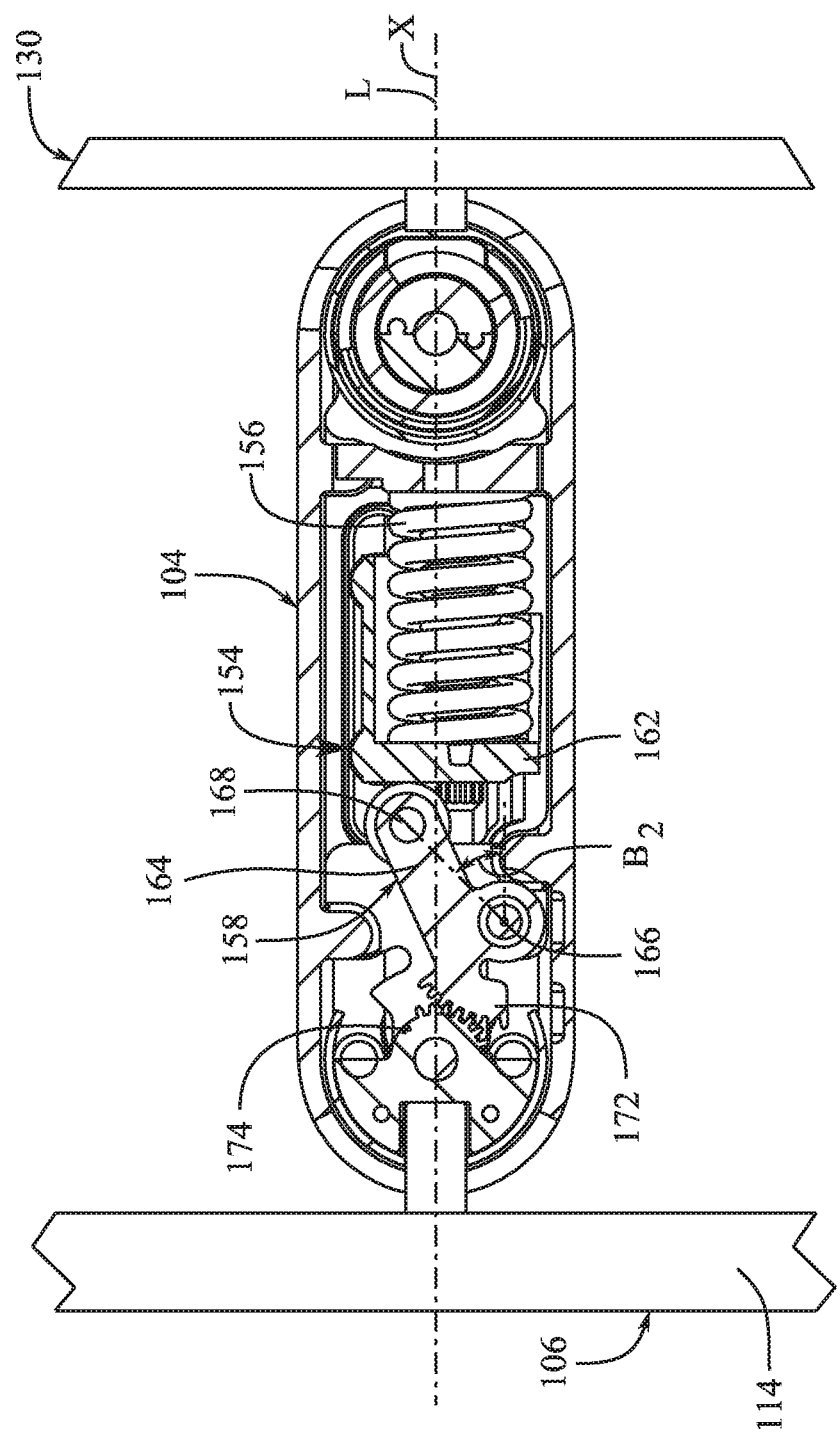
FIG. 13 shows a central side section view of the assembly of FIG. 12.

In the horizontal configuration of FIG. 13, the support arm 104 has rotated its longitudinal axis L to about a zero-degree offset from the horizontal axis X, and angle $B_2$ has increased in magnitude to about 52.5 degrees relative to the longitudinal axis L. Thus, the angle $A_1$ has increased from about negative 45 degrees to about zero degrees, and the angle $B_1$ has increased by about 22.5 degrees in response. The about 22.5-degree change to $B_2$ is about one-half of the amount of angular displacement of the longitudinal axis L.

In the raised configuration of FIG. 15, the support arm 104 has rotated its longitudinal axis L to about a 45-degree angle $A_2$ above the horizontal axis X, and angle $B_3$ has increased to about 75 degrees. Accordingly, each degree of angular displacement of the longitudinal axis L of the support arm 104 correlates with about one-half of a degree of angular displacement of the axis P which extends through the counterbalance pivot point 166 and another stationary point on the counterbalance arm 164. The rate of rotation of the support arm 104 can be double the rate of rotation of axis P.

The block 162 of the yoke 158 can translate within the housing 118 as driven by the energy storage device 156 or the counterbalance arm 164. As shown in FIGS. 5, 7, 8, and 9, the block 162 can comprise laterally-extending axles 176 that fit into a longitudinally-elongated slot 178. The longitudinally-oriented slot 178 can be formed in a block that is part of, and stationary relative to, the housing 118. Accordingly, as the support arm 104 rotates as shown in FIGS. 10-15, the axles 176 can be guided along the slot 178 to limit rotation of the block 162 relative to the housing 118 or energy storage device 156. The axles 176 can constrain the block 162 to translate along the longitudinal axis L that extends through pivot axes 132, 134. In some embodiments, the axles 176 can comprise wheels, rollers, or similar devices to reduce friction between the axles 176 and the slot 178. In some embodiments, axles 176 extend laterally in opposite directions from the block 162 and into two slots 178 positioned on opposite sides of the block 162.

The range of angular displacement of the support arm 104 can be limited by contact between the housing 118 and a surface external to the housing 118, such as by contact between the housing 118 and the stand 106 or between the housing 118 and the display connector 130 or display 102. In some embodiments, the range of angular displacement can be limited by contact between parts moving within the support arm 104. For example, as shown in FIG. 9, the support arm 104 can comprise an angle limiting block 180 that is configured to rotate with the housing 118 about the first pivot axis 132 and rotates relative to the first end support 124. The angle limiting block 180 can have first and second side surfaces 182, 184 configured to come into contact with corresponding surfaces of the first end support 124 when the angle limiting block 180 is rotated to respective predetermined maximum and minimum angles relative to the horizontal axis X.

Angle C illustrates how the second side surface 184 is oriented at an angle relative to the horizontal axis X. As the support arm 104 rotates downward (e.g., to the position of FIG. 10), the second side surface 184 rotates relative to the pivot axis 132 until it contacts the first end support 124 and thereby prevents further downward rotation of the housing 118 relative to the first end support 124. The first side surface 182 performs a similar function for upward rotation. The angle C and the distance between second side surface 184 and the first end support 124 can be designed to define the desired range of downward angular displacement, and a similar angle and distance can be designed to define the range of upward angular displacement. An angle between the two side surfaces 182, 184 can define a total range of angular displacement of the support arm 104.

Limiting angular displacement using the angle limiting block 180 can prevent contact between the housing 118 and the stand 106 or display 102, thereby reducing the chance that they will scratch or dent each other. It can also provide a predetermined amount of gap space or offset between the stand 106 and the display 102, which can beneficially improve air circulation and cable routing through the gap or offset.

Figure 16:
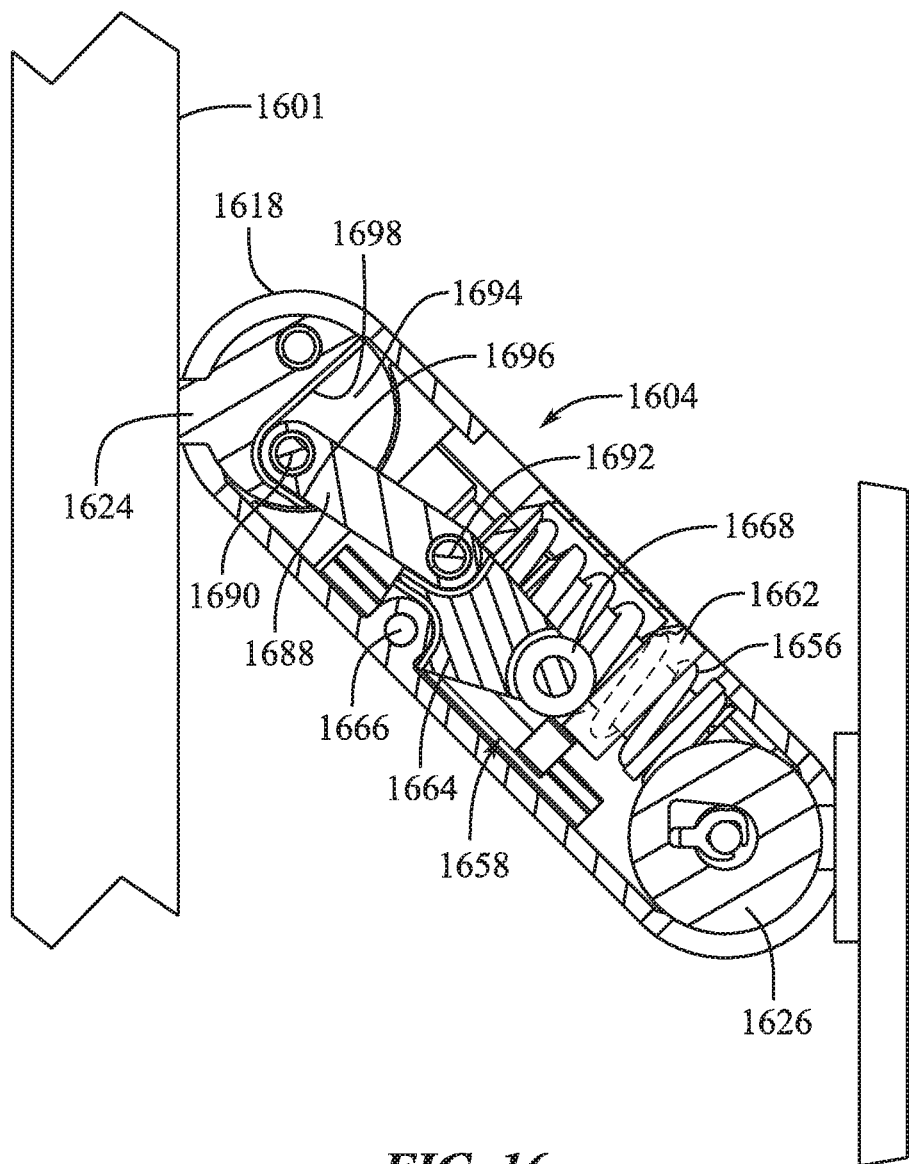
FIG. 16 shows a side section view of another embodiment of a display assembly with the support arm in a lowered position.
Figure 17:
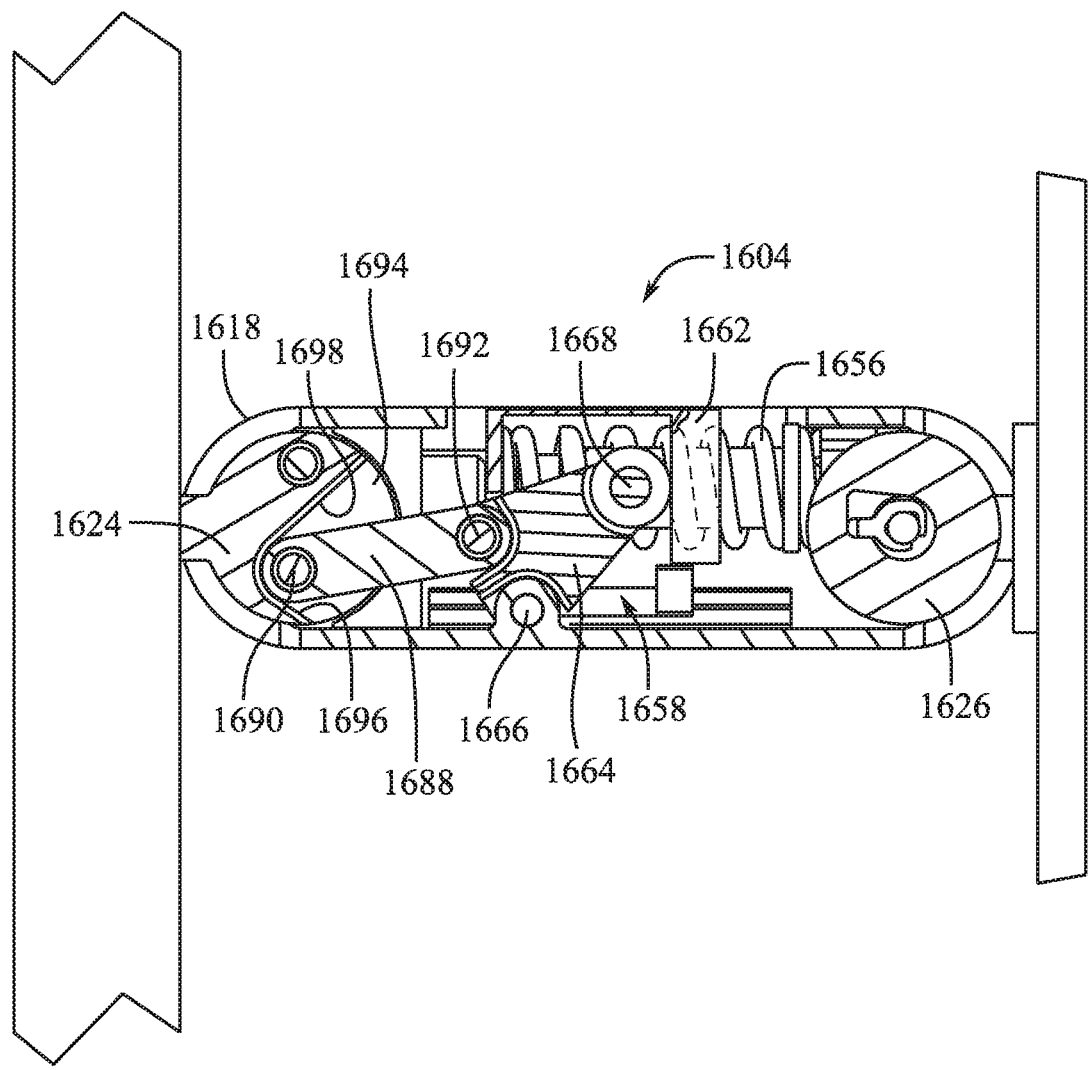
FIG. 17 shows a side section view the assembly of FIG. 16 in a horizontal position.
Figure 18:
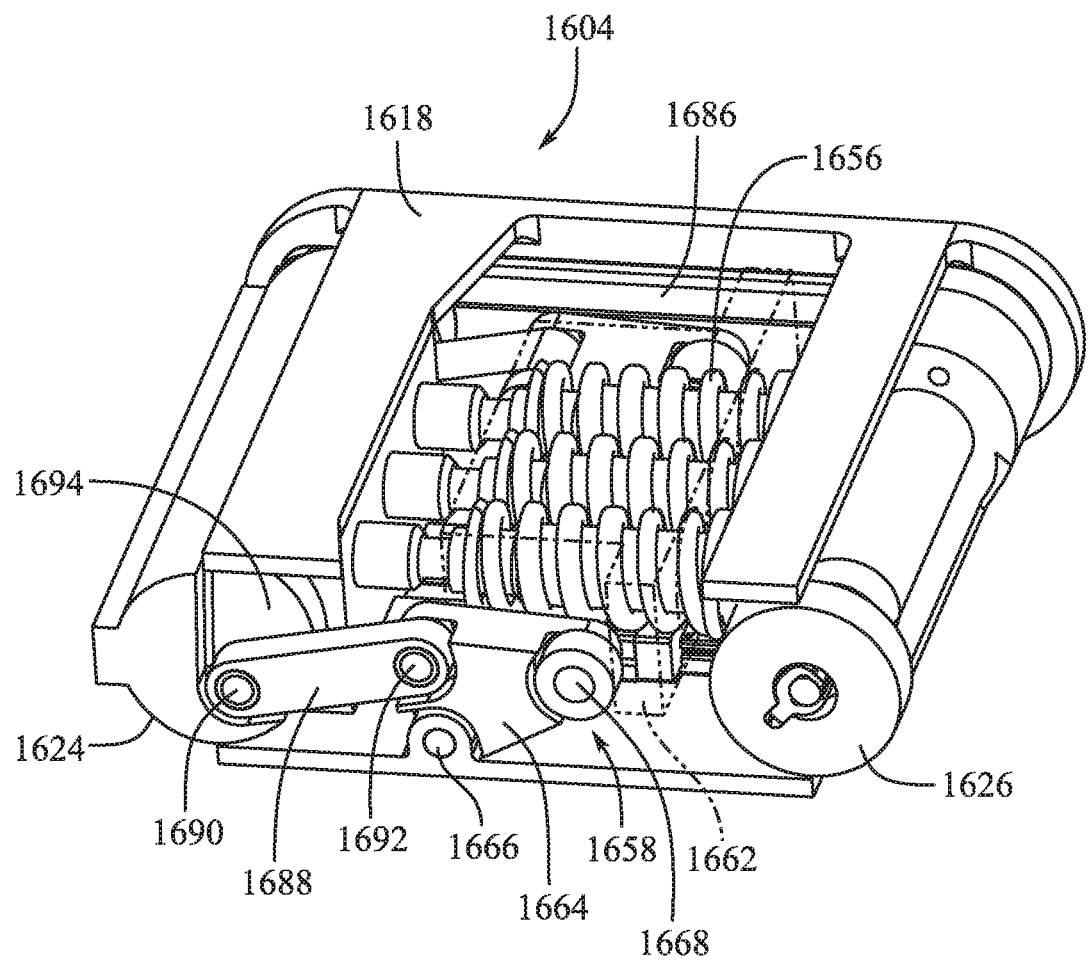
FIG. 18 shows an isometric view of the assembly of FIG. 17.
Figure 19:
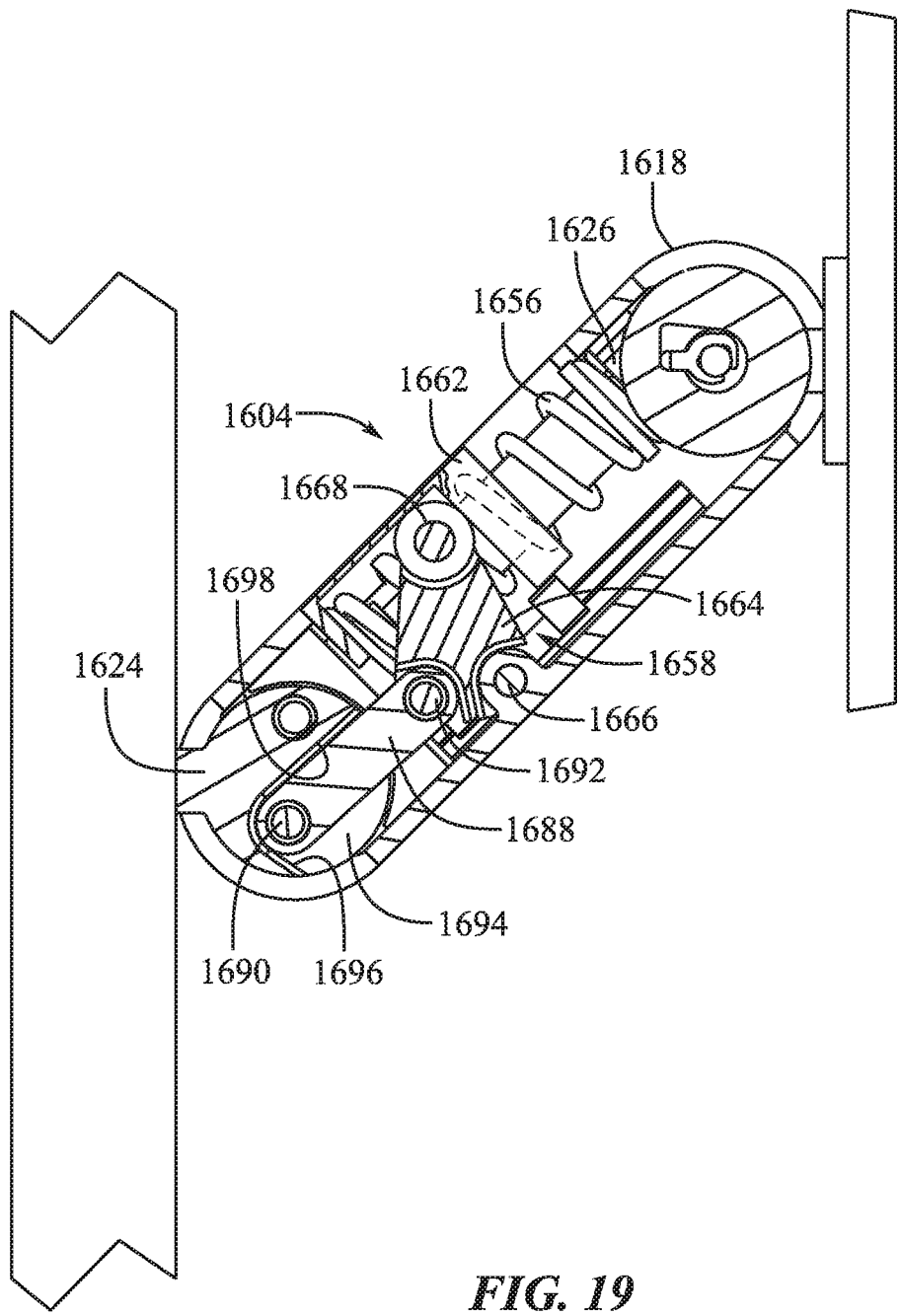
FIG. 19 shows a side section view of the assembly of FIG. 16 in a raised position.

FIGS. 16-19 show another embodiment of a support arm 1604 that can be used in a similar manner to support arm 104. In these figures, elements with similar numbering can serve similar functions to elements of the embodiment of FIGS. 1-15. FIG. 16 is a side section view of the support arm 1604 in a lowered position with a side panel of the housing 1618 with the top and bottom side bars 1636, 1638 removed to expose internal components (one opposite top side bar 1686 is shown in FIG. 18). FIG. 17 is a side view of the support arm 1604 in a horizontal position, and FIG. 19 is a side view of the support arm 1604 in a raised position. FIG. 18 shows an isometric view of the support arm 1604 in the horizontal position with side and top portions of the housing 1618 and side bars 1636, 1638 omitted.

The support arm 1604 can comprise at least one four-bar linkage to control parallel motion of the display 102 relative to the stand 106. Thus, the support arm 1604 can operate similar to the support arm 104 as shown in FIGS. 10, 12, and 14. FIGS. 16-19 therefore show features of a counterbalance mechanism 1658 within the support arm 1604. The counterbalance mechanism 1658 can include a four-bar linkage within the four-bar linkage guiding movement of the display 102. At least one energy storage device 1656 can be positioned in the housing 1618 and can be coupled with a counterbalance block 1662 and a second end support 1626. The block 1662 can be translatable within the housing 1618 in response to forces applied by the energy storage device 1656 and a counterbalance linkage including a counterbalance arm 1664 and a conversion arm 1688. The counterbalance arm 1664 can be pivotally connected to the housing 1618 at a counterbalance pivot point 1666 and can contact the block 1662 at a follower 1668. The conversion arm 1688 can be pivotally connected to the first end support 1624 at an end support pivot point 1690 and to the counterbalance arm 1664 at an arm pivot point 1692. The pivot points 1666, 1690, 1692 and the pivot axis of the housing 1618 relative to the first end support 1624 can form joints of a four-bar linkage within the support arm 1604. The housing 1618, first end support 1624, counterbalance arm 1664, and conversion arm 1688 can be the links of the four-bar linkage of the counterbalance mechanism.

Energy storage device 1656 can store or release potential energy as the block 1662 translates along the longitudinal axis of the support arm 1604. The counterbalance arm 1664 can have its rotation driven by the conversion arm 1688 rather than by gear interaction such as described above with respect to other embodiments. As shown in FIGS. 16-19, as the support arm 1604 rotates, the housing 1618 rotates relative to the first end support 1624. Because the counterbalance arm 1664 is attached to the housing 1618 at pivot point 1666, the counterbalance arm 1664 moves with the housing 1618 relative to the first end support 1624. The distance between the counterbalance pivot point 1666 and the end support pivot point 1690 changes as the housing 1618 moves, so the conversion arm 1688 rotates relative to the first end support 1624. The counterbalance arm 1664 also simultaneously rotates about the counterbalance pivot point 1666 due to the attachment at arm pivot point 1692. The distances between various pivot points 1666, 1690, 1692 and the follower 1668 can provide a 2:1 ratio of angular displacement of the housing 1618 to angular displacement of an axis through the counterbalance pivot point 1666 and another point on the counterbalance arm 1664 (e.g., the follower 1668) or through another two consistent points on the counterbalance arm 1664.

For example, as shown in FIG. 16, an axis through the arm pivot point 1692 and the follower 1668 is about parallel to a longitudinal axis of the housing 1618. After about 90 degrees of upward rotation of the housing 1618, as shown in FIG. 19, the same axis through follower 1668 and pivot point 1692 is at about a 45-degree angle relative to the longitudinal axis of the housing 1618. This ratio of conversion can control the amount of translation of the block 1662 along the longitudinal axis of the housing 1618 and can therefore control the change in potential energy of the energy storage device 1656 as needed to offset the change in potential energy of a mass of a connected display 102. See also FIG. 21 and its related descriptions herein.

In some embodiments, the first end support 1624 can comprise angular displacement limiting features. The conversion arm 1688 can be positioned in a recess 1694 in the first end support 1624 having a lower side surface 1696 and an upper side surface 1698. The lower and upper side surfaces 1696, 1698 can contact the conversion arm 1688 at respective minimum and maximum rotated positions of the housing 1618, as shown in FIGS. 16 and 19. Thus, an angle formed by the lower and upper side surfaces 1696, 1698 can define the range of motion of the conversion arm 1688 and can therefore can define a range of motion of the entire support arm 1604. The interference between the conversion arm 1688 and the side surfaces 1696, 1698 can prevent the counterbalance arm 1664 and its attached housing 1618 from moving.

FIG. 20 illustrates a further embodiment of a support system 2000 in which a display 2002 is mounted to a stand 2006 by a linkage 2004 having a counterbalance mechanism 2008 external to the linkage 2004 and within the stand 2006. Elements having similar names in this embodiment can serve similar functions to the other embodiments described herein.

The linkage 2004 can be a four-bar, parallelogram-shaped linkage with four pivot points 2010, 2012, 2014, 2016. In this embodiment, the housing of the display 2002 provides a part of the four-bar configuration that links pivot points 2010 and 2012. The housing of the stand 2006 provides a part of the four-bar configuration linking pivot points 2014 and 2016. In some embodiments, separate bars can link points 2010/2012 and 2014/2016 respectively, and those separate bars can be mounted to the display 2002 or stand 2006 (e.g., similar to first and second end supports 124, 126). Accordingly, the display 2002 can move parallel to the vertical axis of the stand 2006 since a line through points 2010 and 2012 is parallel to a line through points 2014 and 2016 as the first and second bars 2020, 2022 of linkage 2004 rotate.

The counterbalance mechanism 2008 can have a conversion arm 2023 linked to at least one of the first and second bars 2020, 2022 at a pivot point 2024 on one of the bars. The conversion arm 2023 can be pivotally attached to a counterbalance arm 2026 at an arm pivot point 2025. The counterbalance arm 2026 can be pivotally attached to a housing of the stand 2006 at a counterbalance pivot point 2028 and can have a follower 2030 portion engaging a translatable block 2032 positioned within the stand 2006. The block 2032 is in contact with an energy storage device 2034, and the energy storage device 2034 is constrained at one end 2036.

As the linkage 2004 rotates the bars 2020, 2022, the pivot point 2024 can move along an arc-shaped path about pivot point 2014. The movement of pivot point 2024 drives rotation of the arm pivot point 2025 and the counterbalance arm 2026 about the counterbalance pivot point 2028. The rotation of the counterbalance arm 2026 induces vertical movement of the follower 2030, thereby compressing or expanding the energy storage device 2034 while the bottom end 2036 remains stationary relative to the stand 2006. Accordingly, this embodiment shows how a four-bar linkage 2004 can support and guide movement of the display 2002, and a Scotch yoke-type counterbalance can be positioned external to the linkage 2004.

Figure 21:
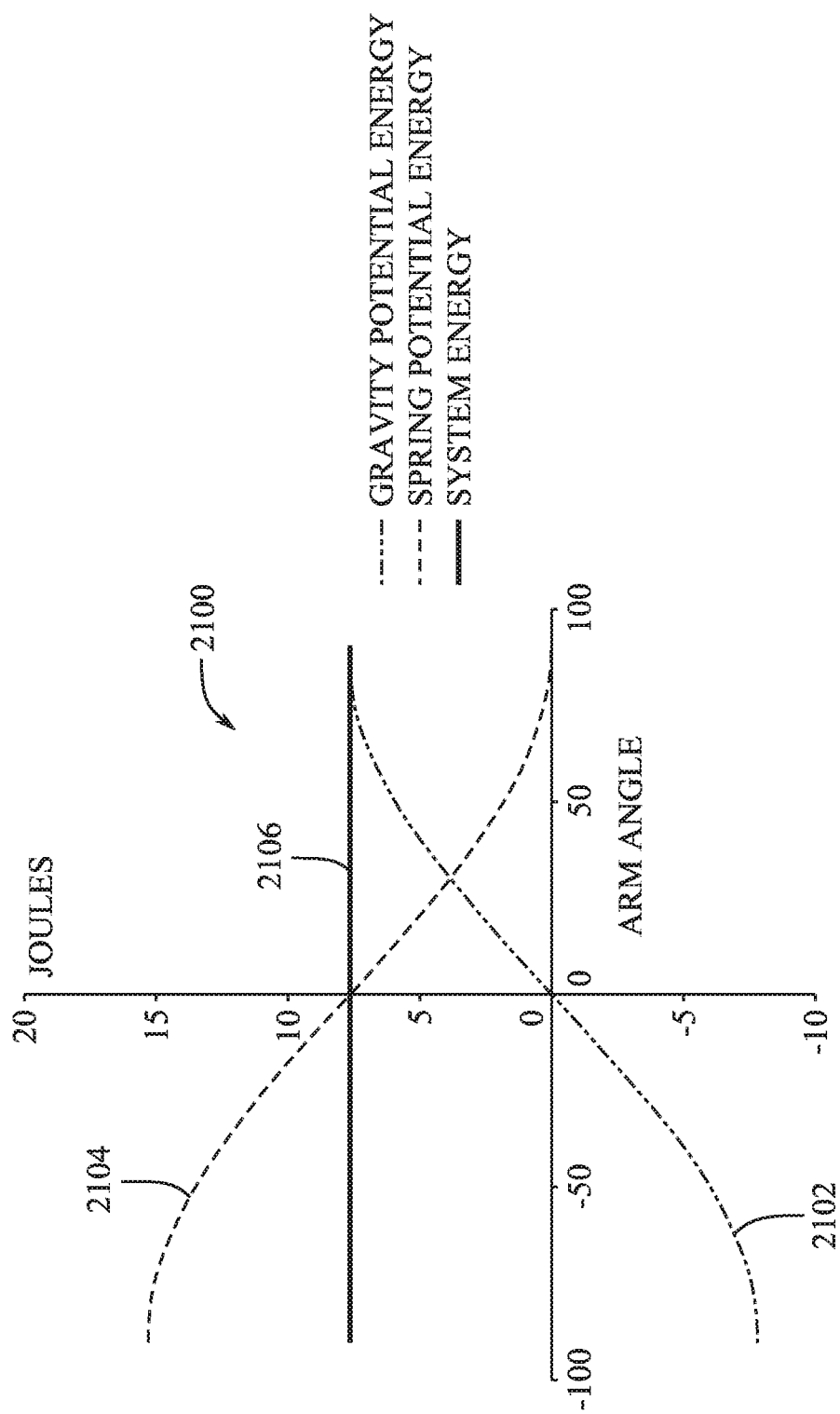
FIG. 21 is a plot of energy versus arm angle for embodiments of the present disclosure.

FIG. 21 provides a plot 2100 of energy versus arm angle according to embodiments of the present disclosure. The arm angle can be defined as the angle of a support arm (e.g., 104 or 1604) relative to a horizontal direction (e.g., horizontal axis X). The gravity potential energy 2102 can be defined as potential energy of the mass of a display and any other connected parts of the support assembly that varies with movement of the support arm. As defined herein, the gravity potential energy 2102 is zero when the support arm is horizontal. Gravity potential energy increases as the support arm is raised, and it lowers as the support arm is lowered.

In order to ensure smooth and low-required-effort operation of the support arm, the potential energy 2104 of the spring or other energy storage device in the system can be controlled, via a counterbalance mechanism, to have a magnitude that changes at the same but opposite rate as the gravity potential energy 2102. Accordingly, the system energy 2106, which represents the sum of the gravity potential energy 2102 and the spring potential energy 2104 at all arm angles, can remain constant as the arm is rotated. As a result, very little input force is required to change the potential energy (i.e., the vertical position) of the display because the spring potential energy provides supplemental energy to assist in rotation of the support arm as the display moves. The changes in the gravity and spring potential energy can correlate in magnitude with the simple harmonic motion of the mass of the display and connected moving components.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A display assembly, comprising:
   an electronic display;
   an arm linkage including:
      a first end support attachable to a support surface;
      a second end support coupled to the electronic display;
      a first bar attached to a first pivot point on the first end support and to a second pivot point on the second end support; and
      a second bar attached to a third pivot point on the first end support and to a fourth pivot point on the second end support;

wherein the first, second, third, and fourth pivot points form a parallelogram; and a counterbalance mechanism including:
   an energy storage device;
   a block coupled to the energy storage device;
   a counterbalance arm having a follower contacting the block;

wherein movement of the electronic display rotates the first bar about the first pivot point, rotates the second bar about the third pivot point, moves the follower relative to the block in a direction perpendicular to an axis extending through the first pivot point and the second pivot point, and translates the block to change a potential energy of the energy storage device; and wherein a rate of change in the potential energy of the energy storage device is lower per degree of rotation of the arm linkage while the arm linkage is moving from a lowered position as compared to a rate of change in the potential energy of the energy storage device while the arm linkage is moving from a raised position.

2. The display assembly of claim 1, further comprising:
a housing containing the arm linkage and the counterbalance mechanism, wherein the counterbalance mechanism comprises a rotatable member having a follower end contacting the block, the rotatable member being configured to pivot in response to the movement of the electronic display and to induce translation of the block; and
a display stand extending below the housing, the support surface being positioned on the display stand;
wherein the second and fourth pivot points are stationary relative to each other during the movement of the electronic display relative to the display stand.

3. The display assembly of claim 1, further comprising a housing containing the arm linkage and the counterbalance mechanism.

4. The display assembly of claim 1, wherein the support surface is part of a display stand.

5. The display assembly of claim 1, wherein the block is part of a Scotch yoke.

6. A display support, comprising:
a base;
an arm extending from the base, the arm including:
   a first end member having a first lateral axis;
   a second end member having a second lateral axis;
   a linkage coupling the first end member to the second end member, wherein the second end member is vertically translatable relative to the first end member without the first or second end members rotating about their respective first or second lateral axes;
   a block; and
   a follower coupled to the block and to the linkage, the follower being configured to move through an arc-shaped path centered at a pivot point on the linkage offset from a central longitudinal axis of the arm as the arm rotates; and
an energy storage structure coupled to the block, the energy storage structure increasing stored energy proportional to downward movement of the second end member and decreasing stored energy proportional to upward movement of the second end member, wherein movement of the follower along the arc-shaped path changes the stored energy.

7. The display support of claim 6, wherein the energy storage structure is positioned in the arm.

8. The display support of claim 6, wherein the first end member comprises a first gear surface and the energy storage structure comprises a second gear surface engaging the first gear surface.

9. The display support of claim 8, wherein the first and second gear surfaces induce rotation of a portion of the energy storage structure at one-half a rate of rotation of the at least one linkage bar.

10. The display support of claim 6, wherein the energy storage structure comprises a biasing member, the biasing member storing energy in response to movement of the second end member, the biasing member applying a force to the block.

11. An electronic display assembly, comprising:
an electronic display having a front-facing viewing surface;
a stand having a vertical axis;
a linkage coupled to the stand, the linkage being coupled to the electronic display; and
a counterbalance assembly having a biasing member and a counterbalance mechanism to change potential energy stored in the biasing member;
wherein application of a force to the electronic display pivots the linkage relative to the stand and relative to the electronic display with the front-facing viewing surface being parallel to the vertical axis; and
wherein application of the force rotates the counterbalance mechanism to change an amount of potential energy stored in the biasing member equal to an amount of changed potential energy of the electronic display, wherein a rate of change of the potential energy follows sinusoidal curvature from a fully raised position relative to a support surface to a fully lowered position relative to the support surface, wherein the rate of change of the potential energy is lower per degree of rotation of the linkage while the linkage is moving from the fully lowered position as compared to the rate of change of the potential energy while the linkage is moving from the fully raised position.

12. The electronic display assembly of claim 11, wherein the counterbalance mechanism comprises a four-bar linkage.

13. The electronic display assembly of claim 11, wherein the counterbalance mechanism comprises a block coupled to the biasing member, wherein rotation of the linkage relative to the stand translates the block.

14. The electronic display assembly of claim 11, wherein the counterbalance mechanism comprises enmeshed gears.

15. The electronic display assembly of claim 11, wherein the linkage is a four-bar linkage.

16. The electronic display assembly of claim 11, wherein the counterbalance assembly is positioned between the electronic display and the stand.

17. A display support, comprising:
a base;
an arm extending from the base, the arm including:
   a first end member having a first lateral axis;
   a second end member having a second lateral axis;
   a linkage coupling the first end member to the second end member, wherein the second end member is vertically translatable relative to the first end member without the first or second end members rotating about their respective first or second lateral axes;
   a block; and
   a follower coupled to the block and configured to move through an arc-shaped path centered at a pivot point offset from a central longitudinal axis of the arm as the arm rotates; and an energy storage structure coupled to the block, the energy storage structure increasing stored energy proportional to downward movement of the second end member and decreasing stored energy proportional to upward movement of the second end member, wherein movement of the follower along the arc-shaped path changes the stored energy;

wherein the first end member comprises a first gear surface and the energy storage structure comprises a second gear surface engaging the first gear surface.

* * * * *